(12) United States Patent
Kim et al.

(10) Patent No.: US 10,811,484 B2
(45) Date of Patent: Oct. 20, 2020

(54) ORGANIC LIGHT EMITTING DISPLAY PANEL AND ORGANIC LIGHT EMITTING DISPLAY APPARATUS USING THE SAME

(71) Applicant: LG Display Co., Ltd., Seoul (KR)

(72) Inventors: DaeHwan Kim, Paju-si (KR); Younghyun Ko, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 2 days.

(21) Appl. No.: 16/216,560

(22) Filed: Dec. 11, 2018

(65) Prior Publication Data

US 2019/0206971 A1  Jul. 4, 2019

(30) Foreign Application Priority Data

Dec. 28, 2017 (KR) ........................ 10-2017-0182800

(51) Int. Cl.
  *H01L 27/32* (2006.01)
  *G09G 3/3291* (2016.01)
  *G09G 3/3233* (2016.01)

(52) U.S. Cl.
  CPC ....... *H01L 27/3276* (2013.01); *G09G 3/3233* (2013.01); *G09G 3/3291* (2013.01); *H01L 27/3258* (2013.01); *H01L 27/3272* (2013.01); *G09G 2300/0426* (2013.01); *G09G 2300/0439* (2013.01)

(58) Field of Classification Search
  CPC ....... G09G 2300/04; G09G 2300/0408; G09G 2300/0421; G09G 2300/0426; G09G 2300/043; G09G 2300/0439; G09G 3/3208; G09G 3/3216; G09G 3/3225; H01L 27/32; H01L 27/3202; H01L 27/3204; H01L 27/3241; H01L 27/3244; H01L 27/3246; H01L 27/3248; H01L 27/3251; H01L 27/3253; H01L 27/3262; H01L 27/3265; H01L 27/3276; H01L 27/3281; H01L 27/3288; H01L 2227/32
  See application file for complete search history.

(56) References Cited

U.S. PATENT DOCUMENTS

| 2002/0038998 | A1* | 4/2002 | Fujita | G09G 3/3233 |
| | | | | 313/495 |
| 2009/0078939 | A1* | 3/2009 | Yamazaki | H01L 21/67144 |
| | | | | 257/59 |
| 2010/0078627 | A1* | 4/2010 | Yoshinaga | H01L 27/3246 |
| | | | | 257/40 |

(Continued)

*Primary Examiner* — Dong Hui Liang
(74) *Attorney, Agent, or Firm* — Seed IP Law Group LLP

(57) ABSTRACT

An organic light emitting display panel and an organic light emitting display apparatus using the same are disclosed, in which a switching transistor and a driving transistor are provided on their respective layers different from each other. To this end, the organic light emitting display panel comprises a substrate partitioned by a plurality of pixels, a driving transistor provided in a first pixel of the pixels and provided on the substrate in a top gate type, a first insulating film for covering the driving transistor, a switching transistor provided on the first insulating film in a top gate type, a second insulating film for covering the first insulating film and the switching transistor, a planarization film provided on the second insulating film, and an organic light emitting diode provided on the planarization film and connected with a driving first conductor of the driving transistor.

20 Claims, 25 Drawing Sheets

(56) References Cited

U.S. PATENT DOCUMENTS

2016/0104418 A1* 4/2016 Keum .................... G09G 5/006
                                                      345/76
2018/0012549 A1* 1/2018 Lee ..................... H01L 27/3276
2018/0012948 A1* 1/2018 Lee ..................... H01L 27/1225

* cited by examiner

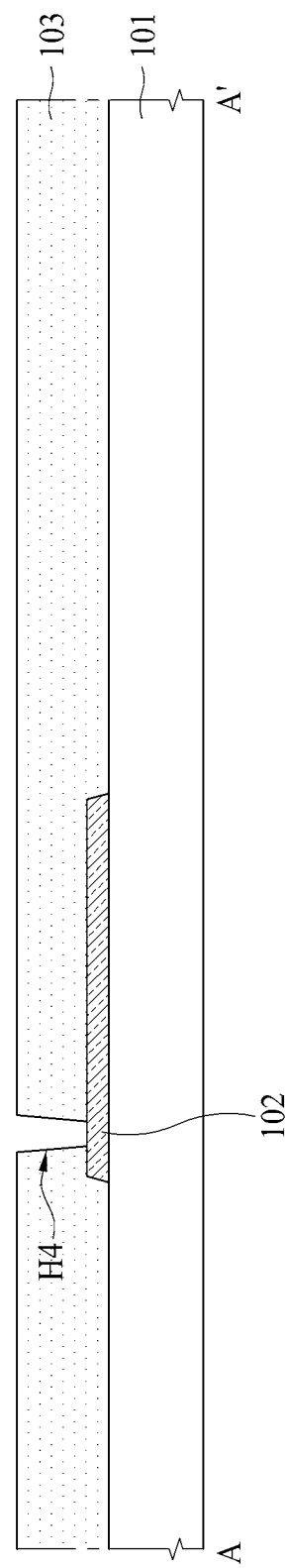

ORGANIC LIGHT EMITTING DISPLAY PANEL AND ORGANIC LIGHT EMITTING DISPLAY APPARATUS USING THE SAME

CROSS-REFERENCE TO RELATED APPLICATIONS

This application claims the benefit of the Korean Patent Application No. 10-2017-0182800 filed on Dec. 28, 2017, which is hereby incorporated by reference as if fully set forth herein.

BACKGROUND

Technical Field

The present disclosure relates to an organic light emitting display panel and an organic light emitting display apparatus using the same.

Description of the Related Art

An organic light emitting display apparatus uses a self-light emitting device, and has low power consumption, and thus has been widely used as a flat panel display apparatus.

FIG. 1 is an exemplary view illustrating a cross-section of an organic light emitting display apparatus of the related art.

Each pixel of an organic light emitting display apparatus may basically be operated with two transistors and one capacitor.

For example, each pixel an organic light emitting display panel of the related art, as shown in FIG. 1, includes a switching transistor Tsw connected with gate line and data line, an organic light emitting diode 30, which includes an anode 31, a light emitting layer 32 and a cathode 33, a driving transistor Tdr connected to the anode 31 and the switching transistor Tsw, and a storage capacitor Cst formed between a gate of the driving transistor and a source of the driving transistor. In this case, the driving transistor Tdr and the switching transistor Tsw are formed on the same layer.

To improve image uniformity and reliability of the organic light emitting display apparatus, a pixel driver constituting each pixel of the organic light emitting display apparatus may further include a compensation circuit that includes at least one transistor.

As the compensation circuit is further provided in the pixel driver, the pixel driver requires additional lines and additional contact holes. Therefore, an area of the pixel driver may be increased, or all elements may not be provided in the pixel driver which is set to a specific width. Particularly, as the organic light emitting display apparatus is realized with high resolution, a spatial restrictive problem caused by the compensation circuit is more increased.

For example, an area of the storage capacitor is reduced by the spatial restriction of the compensation circuit, whereby performance of the driving transistor or performance of the compensation circuit may be deteriorated.

Also, increase of the number of contact holes due to the additional contact holes may cause a process defect.

Even though the compensation circuit is not provided, as the organic light emitting display apparatus is realized with high resolution, problems may occur in that an area of the storage capacitor is reduced, performance of the driving transistor is deteriorated, a process defect is caused, and a spatial restriction is generated.

BRIEF SUMMARY

The present disclosure has been made in view of the above problems, and it is an object of the present disclosure to provide an organic light emitting display panel and an organic light emitting display apparatus using the same, in which a switching transistor and a driving transistor are provided on their respective layers different from each other.

In accordance with an aspect of the present disclosure, the above and other objects can be accomplished by the provision of an organic light emitting display panel comprising a substrate having by a plurality of pixels, a driving transistor provided in a first pixel of the pixels and provided on the substrate in a top gate type, a first insulating film for covering the driving transistor, a switching transistor provided on the first insulating film in a top gate type, a second insulating film for covering the first insulating film and the switching transistor, a planarization film provided on the second insulating film, and an organic light emitting diode provided on the planarization film and connected with a driving first conductor of the driving transistor. In this case, a switching line that includes a switching first conductor, a switching second conductor and a switching active layer, which constitute the switching transistor, is provided on the first insulating film. The switching second conductor is connected with a driving gate electrode of the driving transistor.

In accordance with another aspect of the present disclosure, there is provided an organic light emitting display apparatus comprising the organic light emitting display panel, a gate driver for supplying a gate pulse to gate lines provided in the organic light emitting display panel, a data driver for supplying a data voltage to data lines provided in the organic light emitting display panel, and a controller for controlling the gate driver and the data driver.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION

Figure 1:
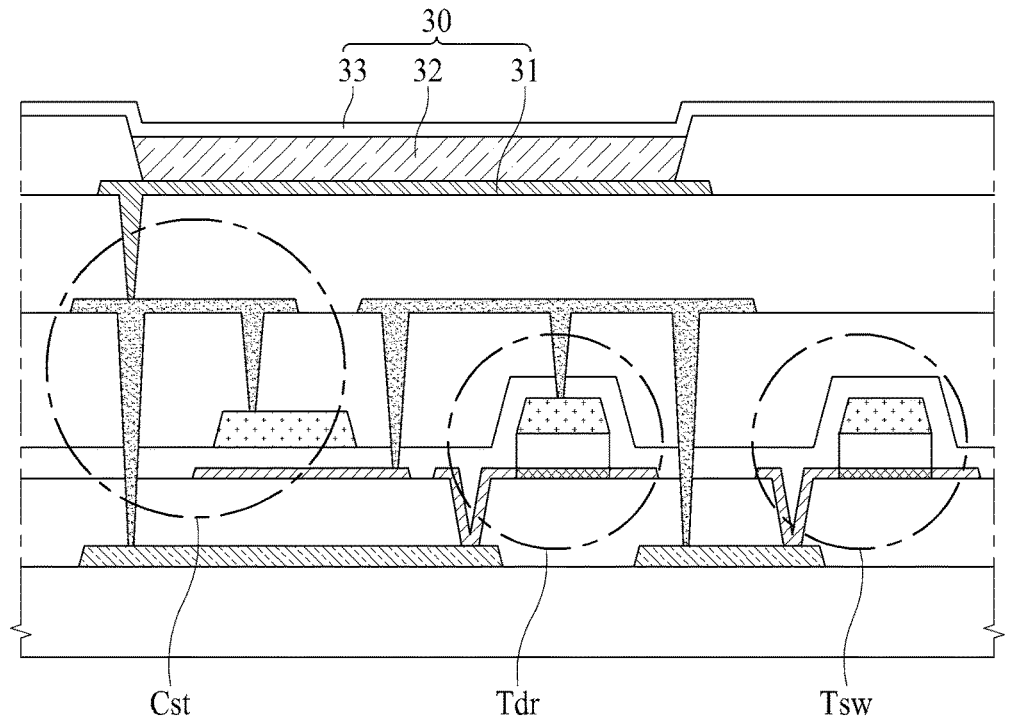
FIG. 1 is an exemplary view illustrating an organic light emitting display panel according to the related art.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

In this specification, wherever possible, the same reference numbers will be used throughout the drawings to refer to the same or like parts.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

It will be understood that, although the terms "first", "second", etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the preferred embodiments of the present disclosure will be described in detail with reference to the accompanying drawings. Hereinafter, an organic light emitting display panel provided with an N type transistor will be described as an example of the present disclosure. However, the organic light emitting display panel according to the present disclosure may be provided with a P type transistor, or may be provided with a hybrid type of an N type transistor and a P type transistor. Therefore, considering the N type transistor or the P type transistor, various modifications may be made in the following description.

Figure 2:
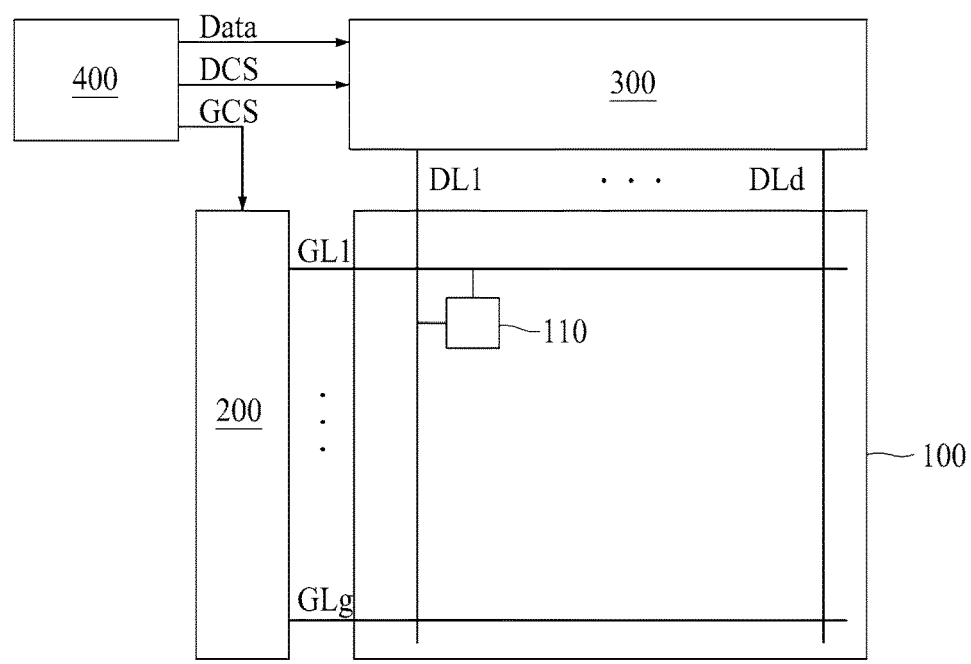
FIG. 2 is an exemplary view illustrating an organic light emitting display panel according to the present disclosure.
Figure 3:
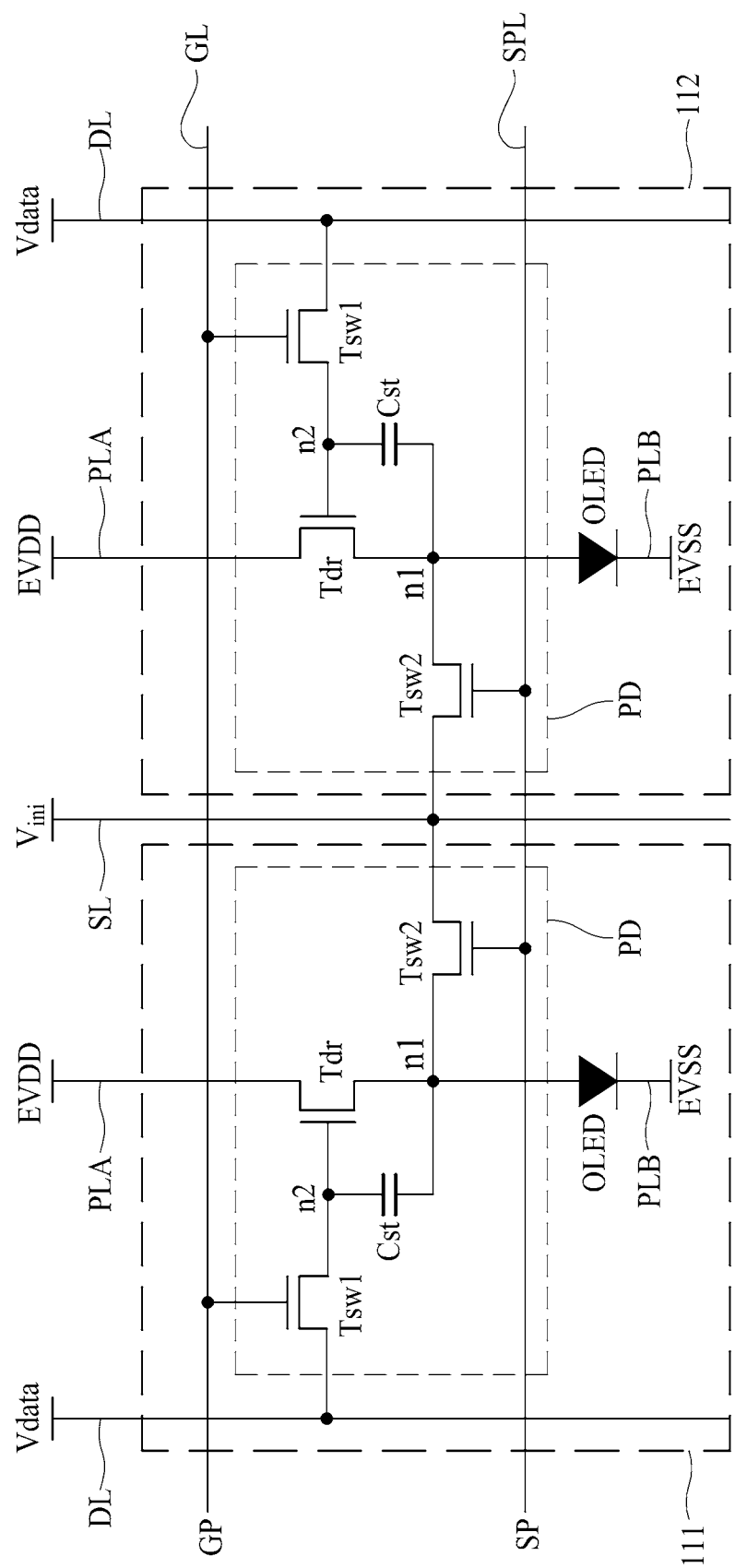
FIG. 3 is a schematic view illustrating two adjacent pixels provided in an organic light emitting display panel according to the present disclosure.

FIG. 2 is an exemplary view illustrating an organic light emitting display panel according to the present disclosure, and FIG. 3 is a schematic view illustrating two adjacent pixels provided in an organic light emitting display panel according to the present disclosure.

The organic light emitting display apparatus according to the present disclosure, as shown in FIG. 2, includes an organic light emitting display panel 100, on which pixels 110 defined by gate lines GL1 to GLg and data lines DL1 to DLd are formed, for outputting an image, a gate driver 200 for sequentially supplying a gate pulse to the gate lines GL1 to GLg provided in the organic light emitting display panel 100, a data driver 300 for supplying a data voltage to the data lines DL1 to DLd provided in the organic light emitting display panel 100, and a controller 400 for controlling the gate driver 200 and the data driver 300.

A structure and function of the organic light emitting display panel 100 will be described as follows.

The organic light emitting display panel 100 includes the gate lines GL1 to GLg to which the gate pulse is supplied, the data lines DL1 to DLd to which the data voltage is supplied, and pixels 110 defined by the gate lines GL1 to GLg and the data lines DL1 to DLd, wherein at least two thin film transistors (hereinafter, simply referred to as transistors) are provided in each of the pixels 110.

Each of the pixels 110 provided in the organic light emitting display panel 100 includes an organic light emitting diode OLED for outputting light, and a pixel driver PD for driving the organic light emitting diode OLED, as shown in FIG. 3.

Signal lines DL, GL, PLA, PLB, SL and SPL for supplying a driving signal to the pixel driver PD are formed in each of the pixels 110.

A data voltage Vdata is supplied to the data line DL, a gate pulse GP is supplied to the gate line GL, a first driving voltage EVDD is supplied to a first voltage supply line PLA, a second driving voltage EVSS is supplied to a second voltage supply line PLB, a sensing voltage Vini is supplied to a sensing line SL, and a sensing pulse SP for turning on or turning off a sensing transistor Tsw2 is supplied to a sensing pulse line SPL. The first driving voltage is supplied from a first driving voltage supply portion, and the second driving voltage is supplied from a second driving voltage supply portion.

The pixel driver PD, as shown in FIG. 3, may include a switching transistor Tsw1 connected with the gate line GL and the data line DL, a driving transistor Tdr for controlling a size of a current output to the organic light emitting diode OLED in accordance with the data voltage Vdata transmitted through the switching transistor Tsw1, and the sensing transistor Tsw2 for sensing characteristics of the driving transistor Tdr. The sensing transistor Tsw2 may be a compensation circuit, and another transistor in addition to the sensing transistor Tsw2 and a capacitor may further be provided in the compensation circuit. The pixel driver PD may further include an emission transistor for controlling a light emitting timing of the driving transistor Tdr and transistors for another purpose in addition to the aforementioned elements.

A storage capacitor Cst is formed between a gate of the driving transistor and an anode of the organic light emitting diode OLED.

The switching transistor Tsw1 is turned on by the gate pulse supplied to the gate line GL, and thus transmits the data voltage supplied to the data line DL to the gate of the driving transistor Tdr.

The sensing transistor Tsw2 is connected to a first node n1 between the driving transistor Tdr and the organic light emitting diode OLED and the sensing line SL and thus turned on or turned off by the sensing pulse SP, and senses characteristics of the driving transistor. Although the sensing transistor Tsw2 may be connected with the sensing line SL one to one, as shown in FIG. 3, two sensing transistors Tsw2 provided in first and second pixels 111 and 112 adjacent to each other may share one sensing line SL. Also, for example, if a red pixel, a green pixel, a blue pixel and a white pixel constitute a unit pixel, four sensing transistors Tsw2 provided in one unit pixel may share one sensing line SL provided in the unit pixel.

A second node n2 connected to the gate of the driving transistor Tdr is connected with the switching transistor Tsw1. The storage capacitor Cst is formed between the second node n2 and the first node n1. If capacitance (hereinafter, simply referred to as storage capacitance) of the storage capacitor Cst is increased, a driving characteristic of the driving transistor Cst may be improved, and sensing sensitivity of the sensing transistor Tsw2 may be improved.

The pixel driver PD may be formed in various structures by further including a transistor and a capacitor in addition to the structure shown in FIG. 3.

The transistors provided in the pixel driver PD may be comprised of at least one of an oxide thin film transistor, an amorphous silicon transistor, a polysilicon thin film transistor, and a low temperature silicon thin film transistor.

The transistor may also be provided in a non-display area outside a display area where the pixels are provided. For example, if the gate driver 200 is embedded in the non-display area of the organic light emitting display panel 100 and the transistors provided in the pixel driver PD are comprised of oxide thin film transistors, the transistors constituting the gate driver 200 may also be comprised of the oxide thin film transistors. Therefore, all the transistors provided in the organic light emitting display panel may be generated by the same process.

Hereinafter, a detailed structure of the organic light emitting display panel 100 according to the present disclosure will be described in detail with reference to FIGS. 3 to 16B.

A function of the controller 400 is as follows.

The controller 400 outputs a gate control signal GCS for controlling the gate driver 200 and a data control signal DCS for controlling the data driver 300 by using timing signals supplied from an external system, for example, a vertical synchronization signal, a horizontal synchronization signal and a clock. The controller 400 realigns input image data input from the external system after sampling the input image data and supplies the realigned digital image data Data to the data driver 300.

A function of the data driver 300 is as follows.

The data driver 300 converts the image data Data input from the controller 400 to an analog data voltage and transmits data voltages Vdata of one horizontal line to the data lines DL1 to DLd per one horizontal period where the gate pulse GP is supplied to the gate line GL.

A function of gate driver 200 is as follows.

The gate driver 200 sequentially supplies the gate pulse to the gate lines GL1 to GLg of the organic light emitting display panel 100 in response to the gate control signal GCS input from the controller 400. Therefore, the switching transistors Tsw1 formed in each pixel to which the gate pulse is input may be turned on, whereby an image may be output to each pixel 110. The gate driver 200 may be formed independently from the organic light emitting display panel 100, and may be provided to be electrically connected with the organic light emitting display panel 100 in various manners. The gate driver 200 may be provided in a gate in panel (GIP) manner in which the gate driver 200 is packaged in the organic light emitting display panel 100.

In the aforementioned description, although the data driver 200, the gate driver 200 and the controller 400 are provided independently, at least any one of the data driver 200 and the gate driver 200 may be provided in a single body with the controller 400.

Figure 4:
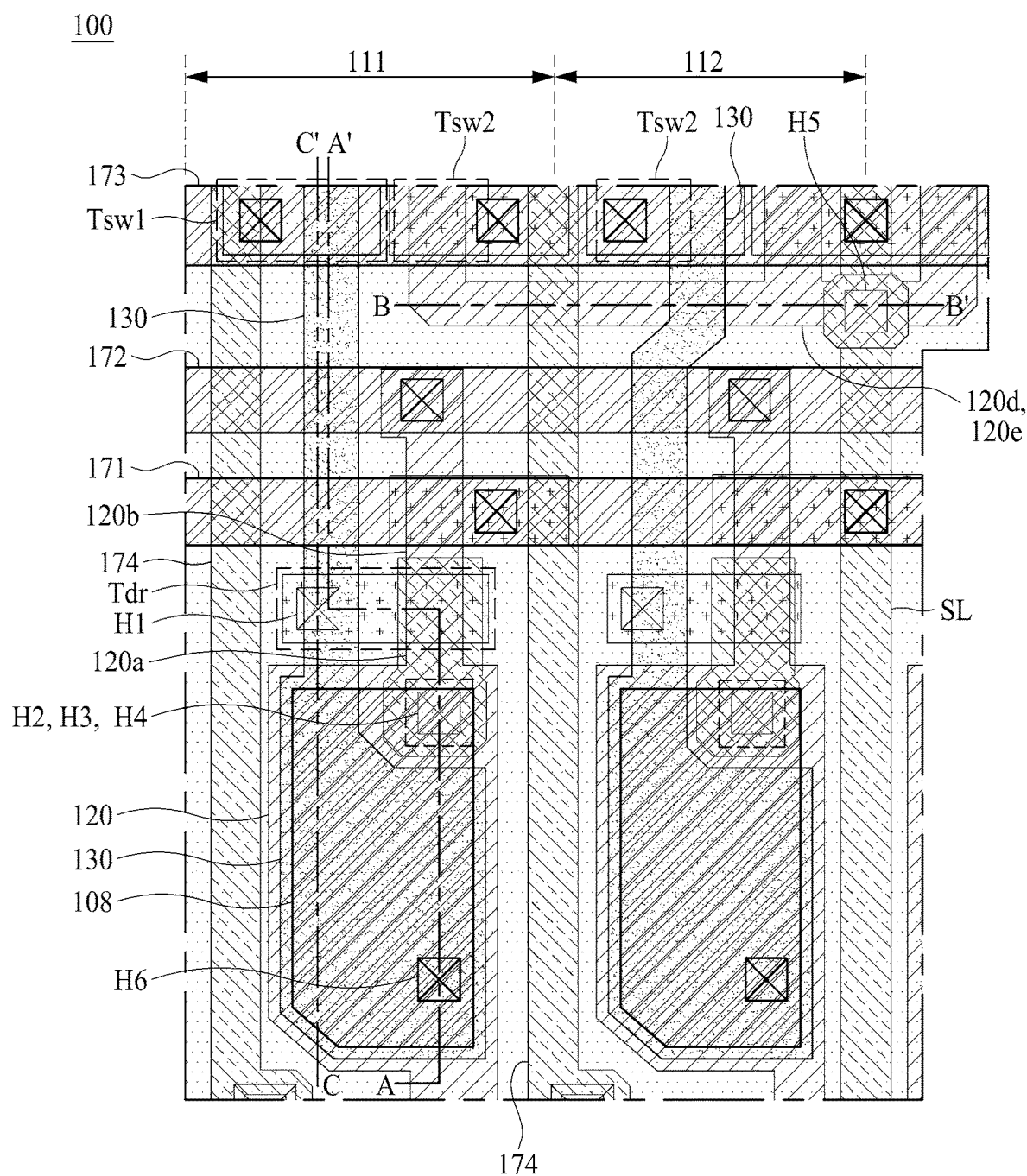
FIG. 4 is a plan view illustrating two pixels provided in an organic light emitting display panel according to the present disclosure.
Figure 5A:
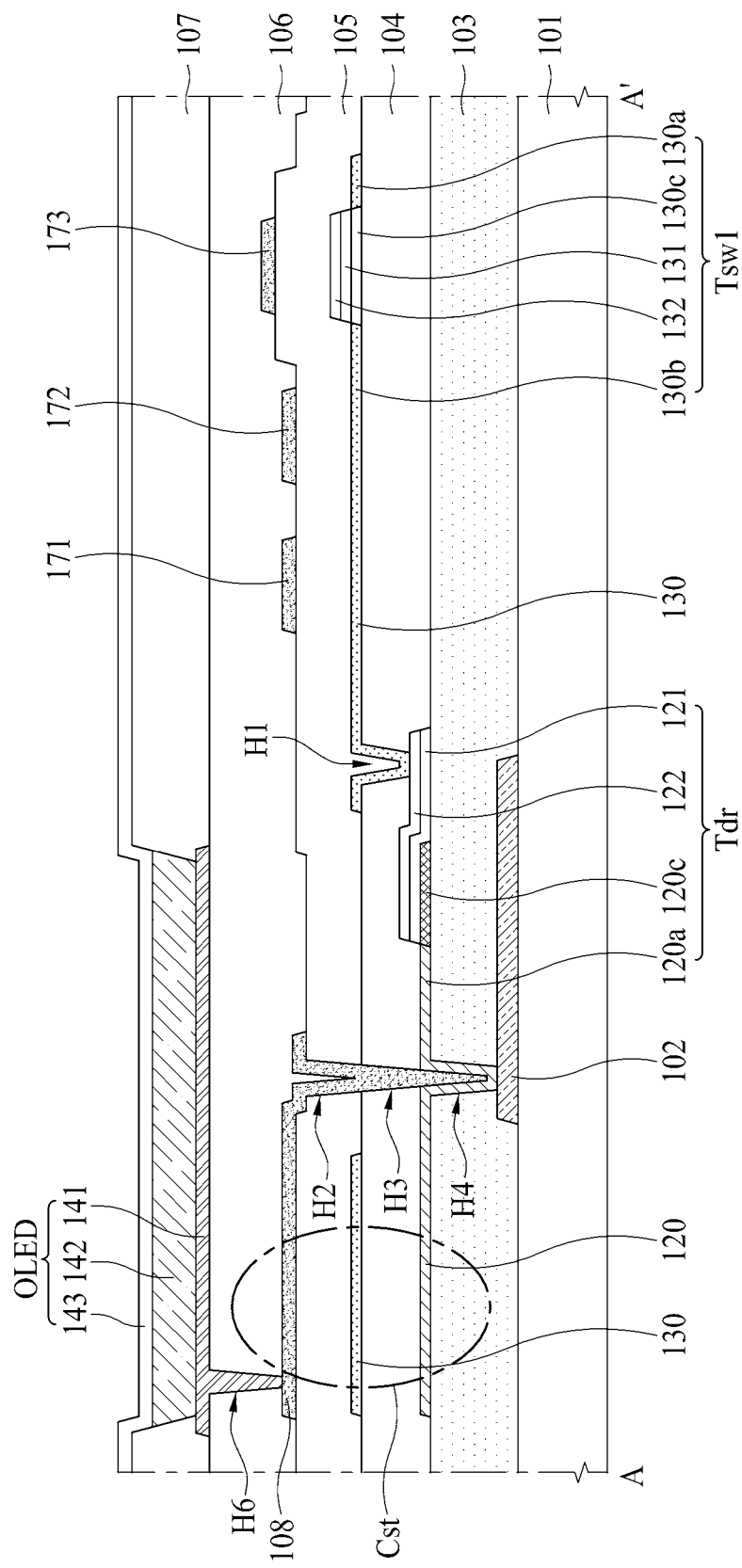
FIG. 5A is an exemplary view illustrating a cross-section taken along line A-A' shown in FIG. 4.
Figure 5B:
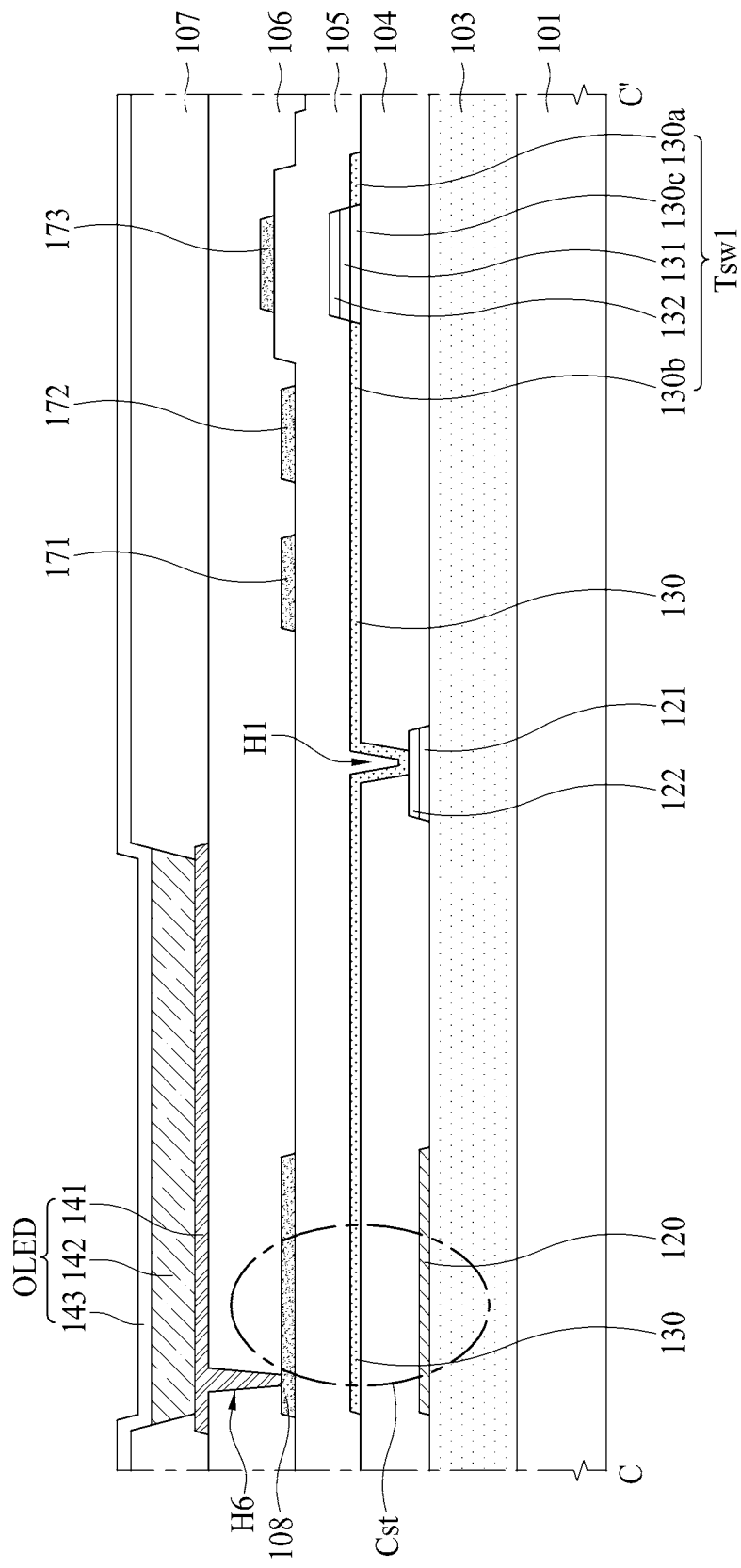
FIG. 5B is an exemplary view illustrating a cross-section taken along line C-C' shown in FIG. 4.

FIG. 4 is a plan view illustrating two pixels provided in an organic light emitting display panel according to the present disclosure, FIG. 5A is an exemplary view illustrating a cross-section taken along line A-A' shown in FIG. 4, and FIG. 5B is an exemplary view illustrating a cross-section taken along line C-C' shown in FIG. 4. Hereinafter, an organic light emitting display panel comprised of transistors which use an oxide semiconductor layer will be described as an example of the present disclosure.

The organic light emitting display panel 100 according to the present disclosure, as shown in FIGS. 3 to 5B, includes a substrate 101 having by a plurality of pixels 110, a driving transistor Tdr provided in the first pixel 111 of the pixels and provided in the first substrate 101 in a top gate type, a first insulating film 104 covering the driving transistor Tdr, a switching transistor Tsw1 provided on the first insulating film 104 in a top gate type, a second insulating film 105 covering the first insulating film 104 and the switching transistor Tsw1, a planarization film 106 provided on the second insulating film 105, and an organic light emitting diode OLED provided on the planarization film 106 and connected with a driving first conductor 120a of the driving transistor. In addition to the aforementioned elements, the first pixel 111 of the organic light emitting display panel 100 may further include a light shield 102 for shielding light entering the driving transistor Tdr, a buffer 103 provided between the light shield 102 and the first insulating film 104, a storage capacitor electrode 108 for forming a storage capacitor Cst together with the first conductor 120a, and a sensing transistor Tsw2 for sensing characteristic change of the driving transistor Tdr. Hereinafter, the elements provided in the first pixel 111 will be described in due order.

First of all, the substrate 101 may be a glass substrate, or may be a plastic substrate. A plurality of pixels 110 are provided in the substrate 101.

Next, the driving transistor Tdr is provided on the substrate 101. The driving transistor Tdr is formed in a top gate type.

For example, a driving line 120 that includes a driving active layer 120c constituting the driving transistor Tdr, a second conductor 120b for driving and a first conductor 120a for driving may be provided between the first insulating film 104 and the substrate 101. In FIG. 5A, the organic light emitting display panel in which a buffer 103 is further provided between the first insulating film 104 and the substrate 101 is provided. In this cases, the driving line 120 may be provided on the buffer 103.

A driving gate insulating film 121 is provided on the driving active layer 120c to overlap the driving active layer 120c, and a driving gate electrode 122 is provided on the driving gate insulating film 121 to overlap the driving gate insulating film 121.

The driving active layer 120c is formed of an oxide semiconductor. The driving first conductor 120a and the driving second conductor 120b are conductors modified from the oxide semiconductor. For example, after the oxide semiconductor is formed in the area corresponding to the driving active layer 120c, the driving first conductor 120a and the driving second conductor 120b, if plasma is injected into the area corresponding to the driving first conductor 120a and the driving second conductor 120b, the oxide semiconductor is conductorized, meaning that it is rendered conductive, whereby the driving first conductor 120a and the driving second conductor 120b are formed.

Although the driving second conductor 120b is connected with the first driving voltage supply portion through the first voltage supply line (PLA) 172, since the driving second conductor 120b is connected to the first voltage supply line (PLA) 172 in an area other than the cross-section taken along line A-A' of FIG. 4, the driving second conductor 120b and the first voltage supply line (PLA) 120b are not connected with each other in FIG. 5A. Also, since the second conductor 120b is not included in the cross-section taken along line A-A' of FIG. 4, the second conductor 120b is omitted in FIG. 5A.

Next, the first insulating film 104 covers the driving transistor Tdr. Particularly, the first insulating film 104 fully covers the driving line 120. The first insulating film 104 is formed of an organic material or an inorganic material, and may be comprised of at least one layer.

Next, the switching transistor Tsw1 is provided on the first insulating film 104. The switching transistor Tsw1 is formed in a top gate type.

For example, a switching line 130 that includes a switching first conductor 130a constituting the switching transistor Tsw1, a switching second conductor 130b and a switching active layer 130c is provided on the first insulating film 104.

In this case, the switching second conductor 130b is connected with the driving gate electrode 122. To this end, a first contact hole H1 is provided on the first insulating film 104, and the switching second conductor 130b is connected with the driving gate electrode 122 through the first contact hole H1 provided on the first insulating film 104.

Although the switching first conductor 130a is connected with the data line DL, since the data line DL is not included in the cross-section taken along line A-A' of FIG. 4, the data line DL connected with the switching first conductor 130a is not shown in FIG. 5.

A switching gate insulating film 131 is provided on the switching active layer 130c to overlap the switching active layer 130c, and a switching gate electrode 132 is provided on the switching gate insulating film 131 to overlap the switching gate insulating film 131.

Although the switching gate electrode 132 is connected with the gate line (GL) 173, since the gate line (GL) 173 is connected with the switching gate electrode 132 in an area other than the cross-section taken along line A-A' of FIG. 4, the switching gate electrode 132 and the gate line (GL) 173 are not connected with each other in FIG. 5A.

The switching active layer 130c is formed of an oxide semiconductor. The switching first conductor 130a and the switching second conductor 130b are conductors modified from the oxide semiconductor. For example, after the oxide semiconductor is formed in the area corresponding to the switching active layer 130c, the switching first conductor 130a and the switching second conductor 130b, if plasma is injected into the area corresponding to the switching first conductor 130a and the switching second conductor 130b, the oxide semiconductor is conductorized, whereby the switching first conductor 130a and the switching second conductor 130b are formed.

Next, the second insulating film 105 covers the first insulating film 104 and the switching transistor Tsw1. The second insulating film 105 is formed of an organic material or an inorganic material, and may be comprised of at least one layer. The storage capacitor electrode 108 may be formed on the second insulating film 105. In addition, various electrodes may be formed. For example, in FIGS. 4, 5A and 5B, a reference number 171 is an emission control line connected with a gate of the emission transistor described as above. A control signal that can turn on or turn off the emission transistor may be supplied to the gate of the emission transistor through the emission control line 171.

Next, the planarization film 106 is provided on the second insulating film 105. The planarization film 106 is formed of an organic material or an inorganic material, and may be comprised of at least one layer.

The planarization film 106 may serve to planarize upper ends of the driving transistor Tdr and the switching transistor Tsw1.

Next, the organic light emitting diode OLED is provided on the planarization film 106, and is connected with the driving first conductor 120a of the driving transistor Tdr.

The organic light emitting diode OLED includes an anode 141, a light emitting layer 142 and a cathode 143.

The anode 141 constituting the organic light emitting diode OLED is connected with the driving first conductor 120a. The organic light emitting diode OLED is surrounded by a bank 107. The pixels may respectively be partitioned by the bank 107.

Next, the storage capacitor electrode 108 is provided on the second insulating film 105, and forms the storage capacitor together with the switching second conductor 130b. Since the switching second conductor 130b is not formed near a fourth contact hole H4 in the line A-A' of FIG. 4, the switching second conductor 130b, that is, the switching line 130 is disconnected in FIG. 5A. However, since the switching line is continuously formed in the line C-C' of FIG. 4, the switching second conductor 130b is continuously formed in FIG. 5B.

The storage capacitor electrode 108 is connected with the driving first conductor 120a. To this end, a second contact hole H2 is provided on the second insulating film 105, and a third contact hole H3 is provided on the first insulating film 104. The storage capacitor electrode 108 is connected with the driving first conductor 120a through the second contact hole H2 and the third contact hole H3.

The storage capacitor electrode 108 connects the driving first conductor 120a with the organic light emitting diode OLED. To this end, a sixth contact hole H6 is formed on the planarization film 106. The anode 141 is connected with the storage capacitor electrode 108 through the sixth contact hole H6, and the storage capacitor electrode 108 is connected with the driving first conductor 120a through the second contact hole H2 and the third contract hole H3. Therefore, the anode 141 may be connected with the first conductor 120a.

Finally, the light shield 102 may be provided in an area of the substrate 101, which corresponds to the driving transistor Tdr. A buffer layer may be provided between the light shield 102 and the substrate 101. The light shield 102 is made of metal.

The light shield 102 is covered by the buffer 103, and the first insulating film 104 is provided on the buffer 103. The buffer 103 is formed of an organic material or an inorganic material, and may be comprised of at least one layer.

Since characteristic of the driving transistor Tdr may be changed if the light shield 102 is not connected with the other electrodes but floated, the light shield 102 may be connected with the driving first conductor 120*a*. To this end, a fourth contact hole H4 is formed on the buffer 103, and the driving first conductor 120*a* may be connected with the light shield 102 through the fourth contact hole H4.

Figure 6A:
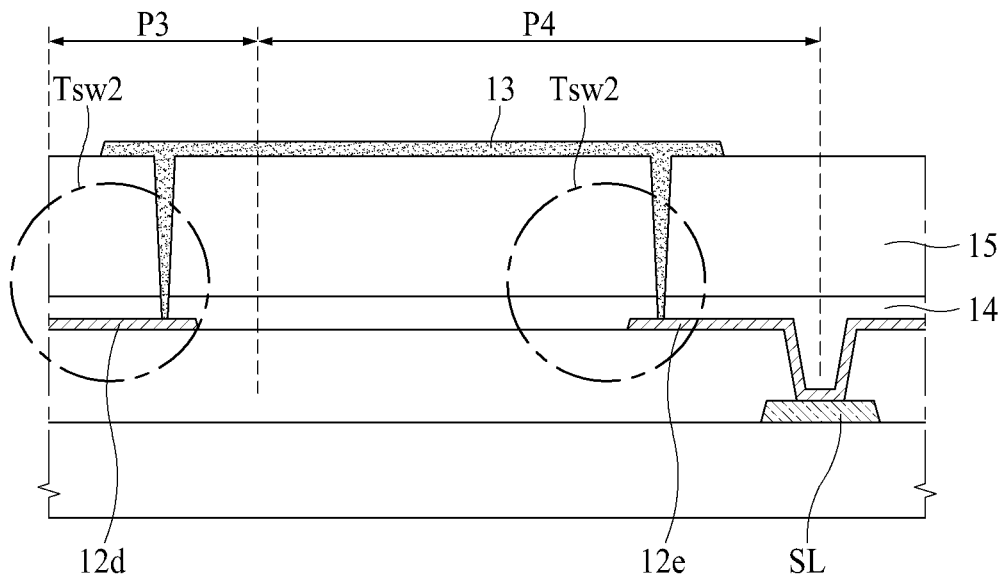
In FIG. 6A is an exemplary view illustrating a cross-section of sensing transistors provided in two adjacent pixels P3 and P4 in the organic light emitting display panel of the related art.
Figure 6B:
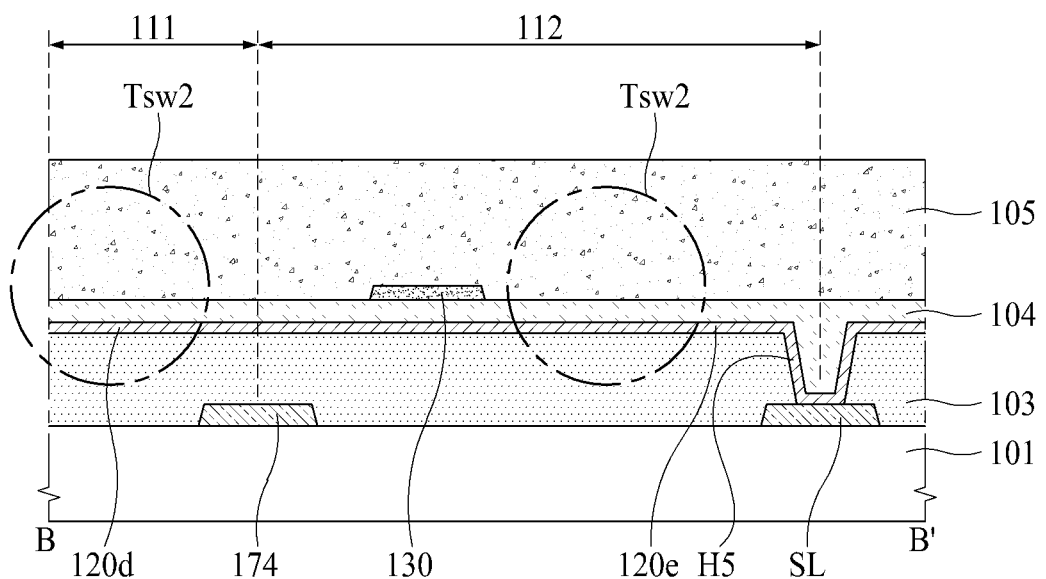
FIG. 6B is an exemplary view illustrating a cross-section taken along line B-B' shown in FIG. 4.

FIG. 6B is an exemplary view illustrating a cross-section taken along line B-B' shown in FIG. 4. In FIG. 6A is an exemplary view illustrating a cross-section of sensing transistors provided in two adjacent pixels P3 and P4 in the organic light emitting display panel of the related art, and 6B is an exemplary view illustrating a cross-section of sensing transistors Tsw2 provided in first and second pixels 111 and 112 shown in FIG. 3. Particularly, a sensing second conductor 120*d* constituting the sensing transistor Tsw2, connected with the sensing line SL is shown in FIG. 6B.

As described above, the sensing transistor Tsw2 for sensing characteristic change of the driving transistor Tdr may further be provided in the organic light emitting display panel 100 according to the present disclosure.

The sensing transistor Tsw2 provided in the first pixel 111 may be connected between the driving first conductor 120*a* and the sensing line SL as shown in FIG. 3 and of FIG. 6B.

The sensing transistor Tsw2 includes a sensing first conductor extended from the driving line 120, a sensing active layer provided on the same layer as the sensing first conductor and connected with the sensing first conductor, and a sensing second conductor 120*d* provided on the same layer as the sensing active layer, connected with the sensing active layer and connected with the sensing line SL. The sensing first conductor and the sensing second conductor 120*d* are conductors, and the sensing active layer may be made of an oxide semiconductor. Since the sensing first conductor and the sensing active layer, which constitute the sensing transistor Tsw2, are not included in the cross-section taken along line B-B' of FIG. 4, the sensing first conductor and the sensing active layer are not shown in FIG. 6B. The electrode 12*d* corresponding to the sensing second conductor 120*d* is only shown in FIG. 6A. In FIG. 6B, a reference number 174 denotes the data line shown in FIG. 4, and a reference number 130 denotes the switching line shown in FIG. 4.

The driving line 120 further includes the sensing first conductor, the sensing active layer, and the sensing second conductor 120*d*. That is, the driving line 120 provided in the buffer 103 may include the driving transistor Trd and the sensing transistor Tsw2.

The sensing transistor Tsw2 corresponding to the sensing transistor Tsw2 provided in the first pixel 111 is also provided in the second pixel 112 adjacent to the first pixel 111.

The sensing transistor Tsw2 provided in the second pixel 112 includes a sensing first conductor, a sensing active layer and a sensing second conductor 120*e*, which correspond to the sensing first conductor, the sensing active layer and the sensing second conductor 120*d*, which are provided in the first pixel 111.

In this case, the sensing second conductor 120*d* provided in the first pixel 111 and the sensing second conductor 120*e* provided I the second pixel are connected with each other on the same layer, for example, the buffer 103, as shown in FIG. 6B.

To connect the sensing second conductor 120*d* provided in the first pixel 111 and the sensing second conductor 120*e* provided in the second pixel 112 with the sensing line SL, the buffer 103 may be provided between the first insulating film 104 and the substrate 101, the sensing line SL may be provided between the buffer 103 and the substrate 101, and the sensing second conductor 120*d* provided in the first pixel 111 and the sensing second conductor 120*e* provided in the second pixel 112 are connected with the sensing line SL through a fifth contact hole H5 provided on the buffer 103.

That is, if the sensing transistor Tsw2 is provided in each pixel of the organic light emitting display panel according to the present disclosure, the sensing second conductors 120*d* and 120*e* provided in adjacent pixels, as shown in FIG. 6B, are connected with each other on the same layer, for example, the buffer 103, and the driving line 120 includes the sensing second conductors 120*d* and 120*e*.

In this case, supposing that the first pixel 111 and the second pixel 112 are pixels in the nth horizontal line of the organic light emitting display panel 100, the sensing second conductors 120*d* and 120*e* shown on the top of FIG. 4 are connected with the driving line 120 formed in the n−1th horizontal line provided on the nth horizontal line.

In more detail, the sensing second conductors 120*d* and 120*e* formed on the n−1th horizontal line are connected with the driving line 120 that forms the driving transistor Tdr formed on the nth horizontal line.

As described above, in the present disclosure, the sensing second conductors 120*d* and 120*e* commonly connected with one sensing line SL and provided in their respective pixels are continuously provided on the same layer without a separate bridge as shown in FIG. 6B. Therefore, a contact hole for connecting the bridge with the sensing second conductors 120*d* and 120*e* is not required on the first insulating film 104 and the second insulating film 105.

However, in the organic light emitting display panel of the related art, as shown in FIG. 6A, since sensing second conductors 12*d* and 12*e* commonly connected with one sensing line SL and provided in their respective pixels are connected with each other through a bridge 13, contact holes should be provided on the first insulating film 14 and the second insulating film 15 which cover the sensing second conductors 12*d* and 12*e*.

In more detail, in the present disclosure, since the sensing second conductors 120*d* and 120*e* commonly connected with one sensing line SL and provided in their respective pixels are not required to be connected with each other through a bridge, a contact hole for connection of the bridge is not required. Therefore, the number of contact holes of the organic light emitting display panel according to the present disclosure may be smaller than the number of contact holes of the organic light emitting display panel of the related art. As a result, a layout of high resolution may easily be designed, the manufacturing process of the organic light emitting display panel may be simplified, and a defect that may occur in the manufacturing process of the contact holes may be reduced.

Figure 7A:
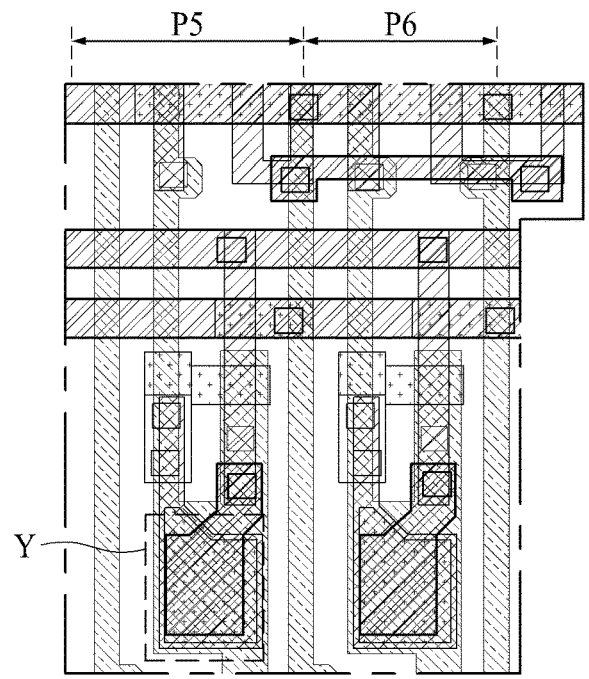
FIG. 7A is a plan of two adjacent pixels provided in an organic light emitting display panel of the related art.
Figure 7B:
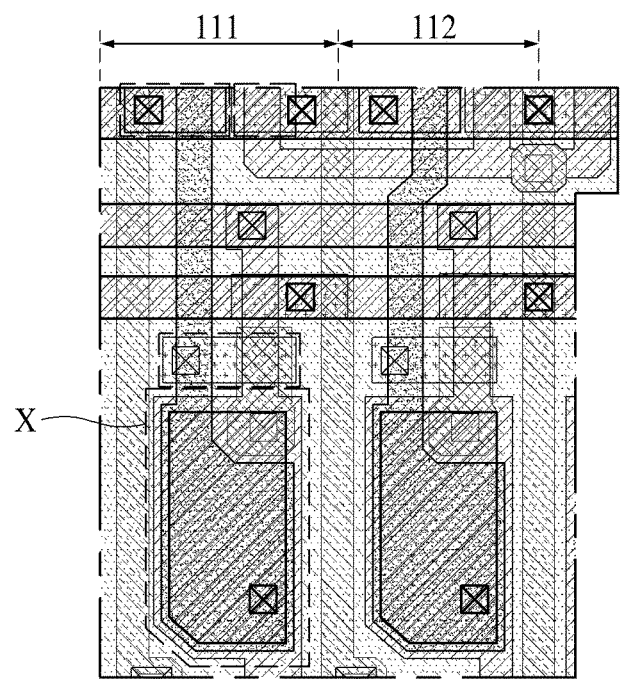
FIG. 7B is an exemplary plan view illustrating two adjacent pixels provided in an organic light emitting display panel according to the present disclosure.

FIG. 7B is an exemplary view illustrating a plan of two adjacent pixels provided in an organic light emitting display panel according to the present disclosure and FIG. 7A is a plan of two adjacent pixels provided in an organic light emitting display panel of the related art. In FIG. 7A is an exemplary view illustrating a plan of two adjacent pixels P5 and P6 in the organic light emitting display panel of the related art, and 7B is an exemplary view illustrating a plan of two adjacent pixels 111 and 112 of the organic light emitting display panel according to the present disclosure. Particularly, FIG. 7B illustrates the same plan as that shown in FIG. 4.

In the organic light emitting display panel 100 according to the present disclosure, as described with reference to FIGS. 4, 5A, 5B and 6B, the number of contact holes may be reduced as compared with the organic light emitting display panel 100 of the related art.

Also, even in the case that the organic light emitting display panel of the related art shown in FIG. 1 is compared with the organic light emitting display panel 100 according to the present disclosure shown in FIG. 5, the number of contact holes of the organic light emitting display panel 100 according to the present disclosure is smaller than the number of contact holes of the organic light emitting display panel of the related art.

In the organic light emitting display panel 100 according to the present disclosure, as described above, the storage capacitor electrode 108 and the switching second conductor 130b may form the storage capacitor Cst, and the driving first conductor 120a and the switching second conductor 130b, which are connected with the storage capacitor electrode 108, may form the storage capacitor Cst.

As described above, in the organic light emitting display panel according to the present disclosure, the number of contact holes may be reduced, whereby areas of the driving first conductor 120a and the switching second conductor 130b may be increased as compared with the related art.

Therefore, an area X of the storage capacitor of the organic light emitting display panel 100 according to the present disclosure shown in FIG. 7B may be more increased that an area Y of the storage capacitor of the organic light emitting display panel of the related art shown in FIG. 7A.

As the area of the storage capacitor Cst is increased, performance of the driving transistor Tdr and performance of the sensing transistor Tsw2 may be improved.

FIGS. 8A to 16B are exemplary views illustrating a method for manufacturing an organic light emitting display panel according to the present disclosure. In FIGS. 8A to 16B, FIGS. 8A, 9A, 10A, 11A, 12A, 13A, 14A, 15A and 16A illustrate plans of two pixels 111 and 112 of the organic light emitting display panel, particularly, plans as shown in FIG. 4 and FIG. 7B. Also, in FIGS. 8A to 16B, FIGS. 8B, 9B, 10B, 11B, 12B, 13B, 14B, 15B and 16B illustrate cross-sections of one of the pixels, for example, the first pixel 111, which is taken along line A-A' of FIG. 4. Hereinafter, methods for forming the cross-section shown in FIG. 5A and the plans shown in FIG. 4 and FIG. 7B will be described with reference to FIGS. 8A to 16B. In the following description, description the same as or similar to the description made with reference to FIGS. 2 to 7B will be omitted or briefly described.

Figure 8A:
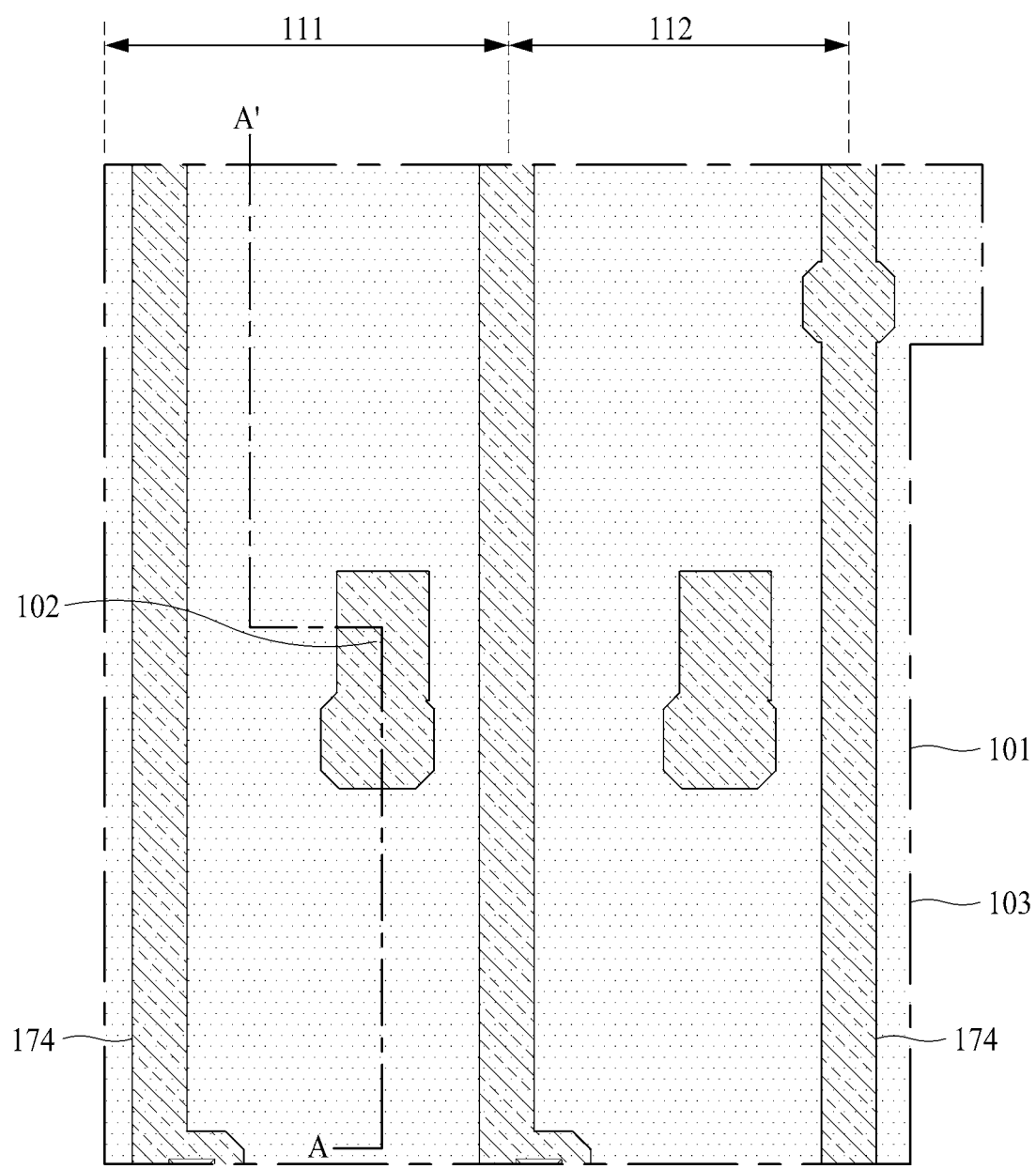
FIGS. 8A to 16B are exemplary views illustrating a method for manufacturing an organic light emitting display panel according to the present disclosure.
Figure 8B:
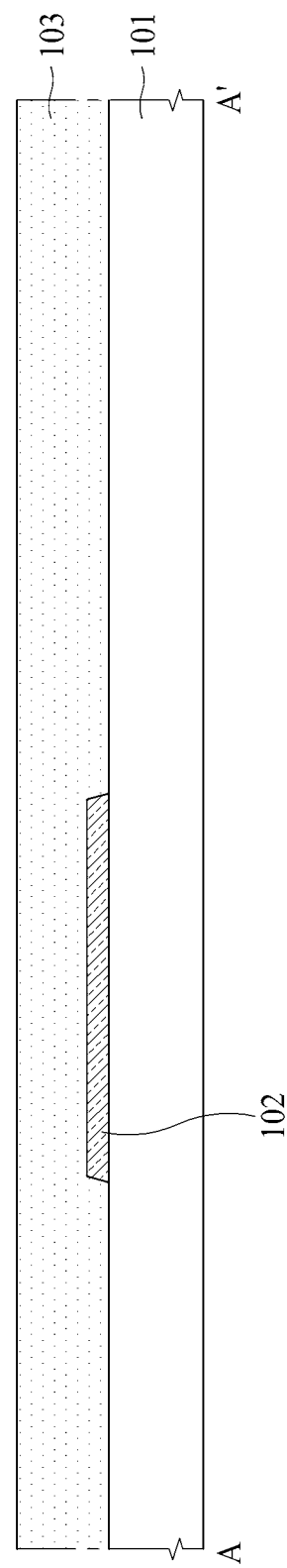

First of all, as shown in FIGS. 8A and 8B, a metal material is provided on the substrate 101, and the light shield 102 is formed by the metal material. As shown in FIG. 8A, lines used as various wires as well as the light shield 102 formed at a lower end of the driving transistor Tdr may be formed on the substrate 101 by the metal material. For example, the data line (DL) 174 may be formed on the substrate 101 together with the light shield 102.

The light shield 102 and the lines, which are formed of the metal material, are covered by the buffer 103.

Figure 9A:
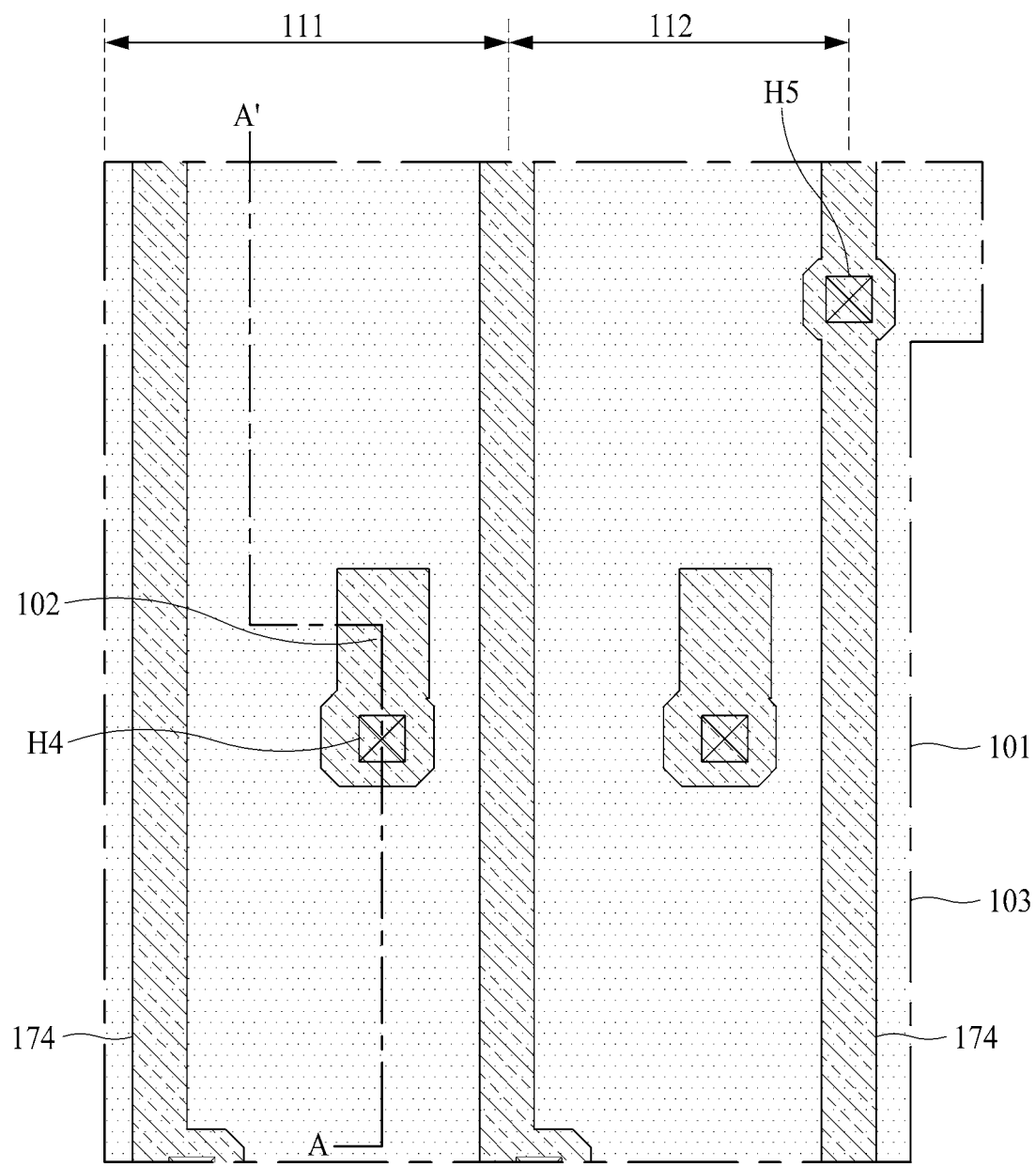

Next, as shown in FIGS. 9A and 9B, a fourth contact hole H4 for partially exposing the light shield 102 is formed on the buffer 103.

Figure 10A:
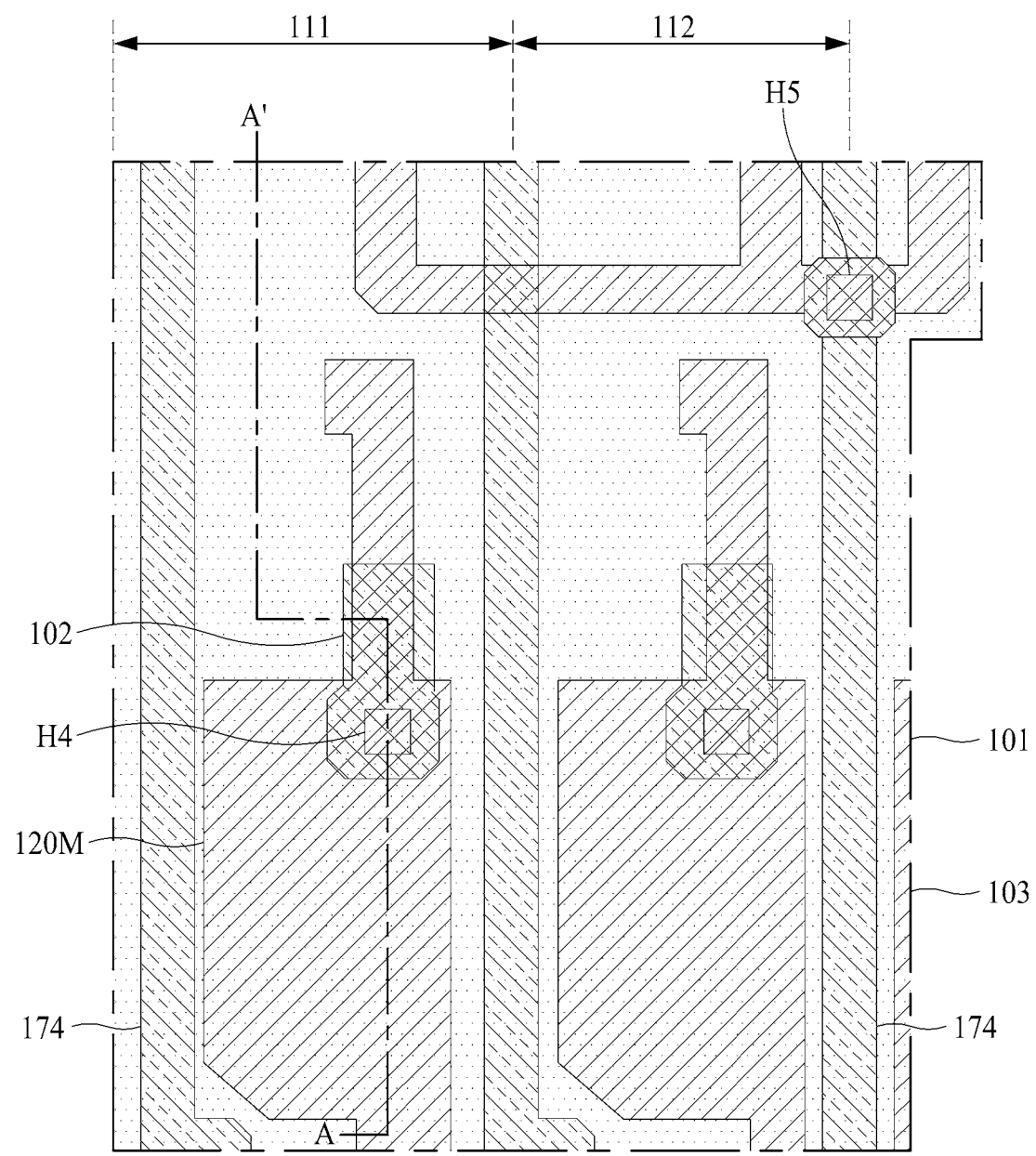
Figure 10B:
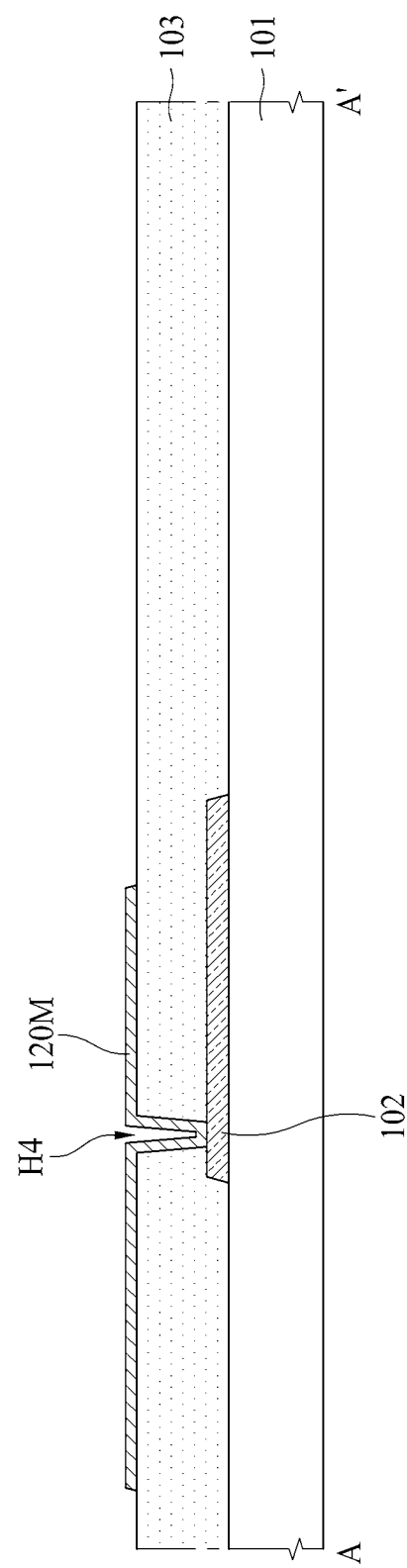

Next, as shown in FIGS. 10A and 10B, an oxide semiconductor 120M is formed on the buffer 103, and is connected with the light shield 102 through the fourth contact hole H4.

Figure 11A:
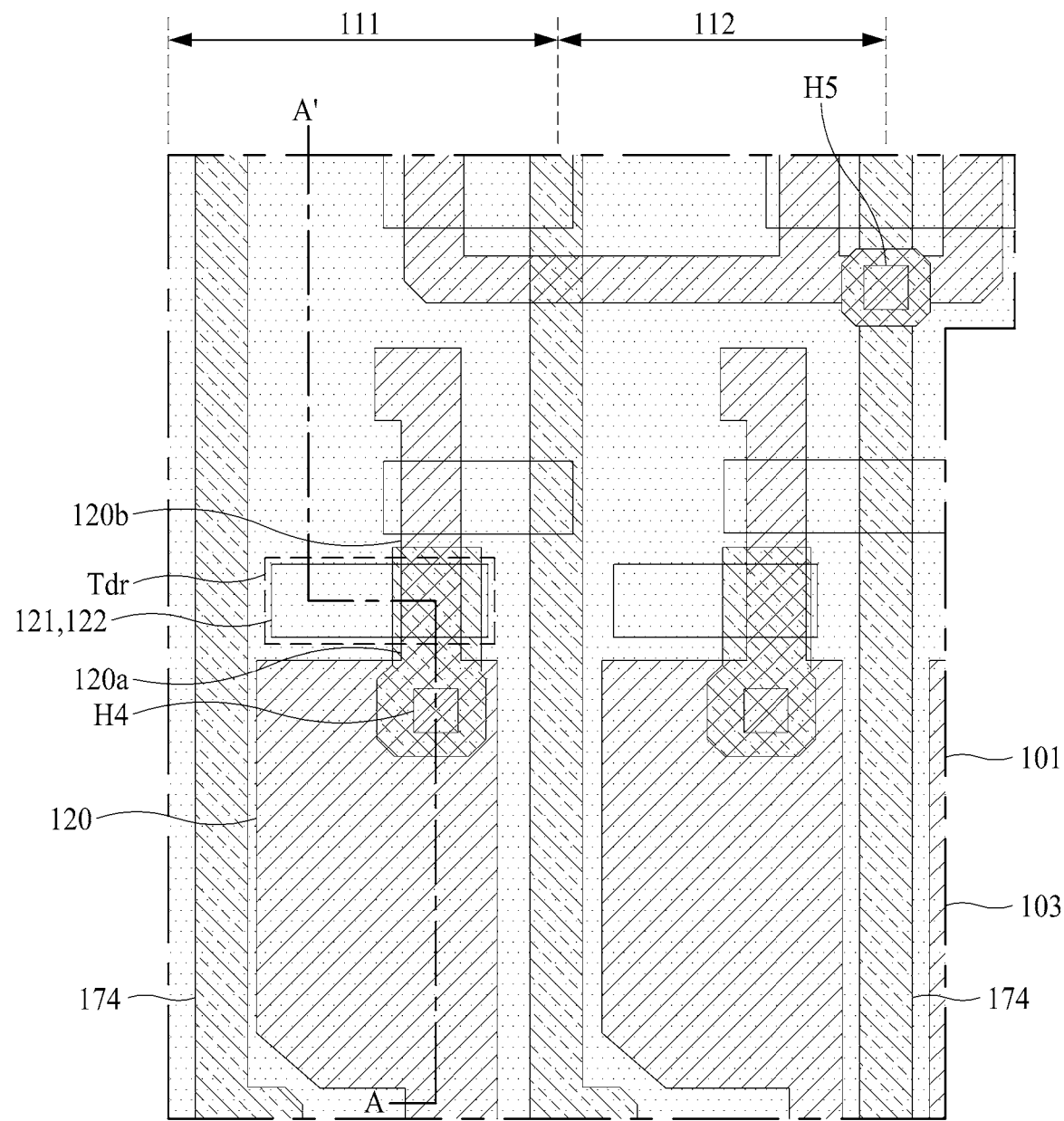
Figure 11B:
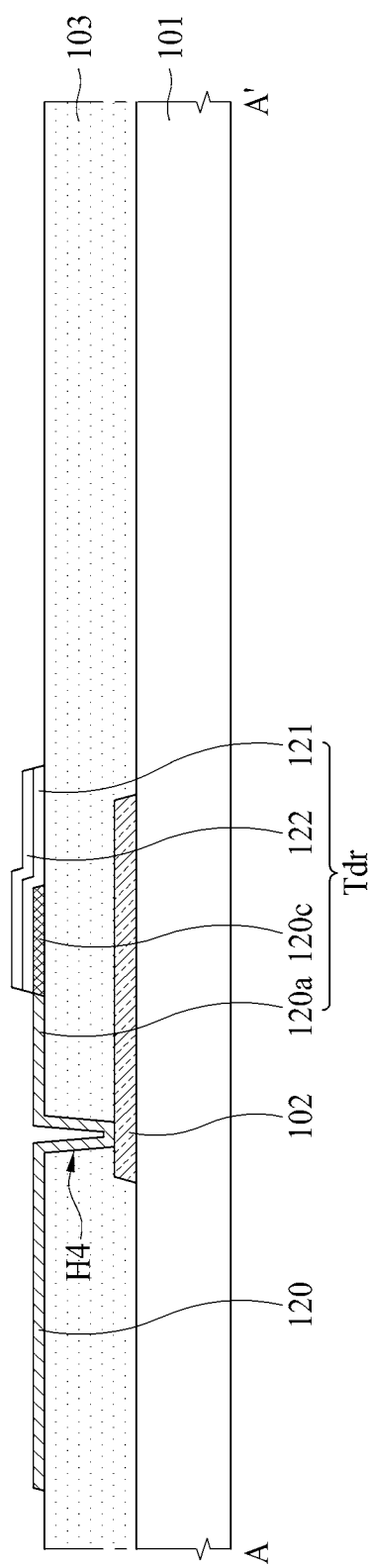

Next, as shown in FIGS. 11A and 11B, the driving gate insulating film 121 and the driving gate electrode 122 are formed on the oxide semiconductor 120M.

If plasma is irradiated into the oxide semiconductor 120M using the driving gate insulating film 121 and the driving gate electrode 122 as masks, the oxide semiconductor 120M is changed to a conductor. Since an area overlapped with the driving gate insulating film 121 and the driving gate electrode 122 of the oxide semiconductor 120M is not affected by plasma, the area is maintained as the oxide semiconductor and becomes the driving active layer 120c. The conductorized area of the oxide semiconductor 120M includes the driving first conductor 120a and the driving second conductor 120b.

The driving active layer 120c, the driving first conductor 120a, the driving second conductor 120b, the driving gate insulating film 121 and the driving gate electrode 122 form the driving transistor Tdr.

The driving active layer 120c, the driving first conductor 120a, and the driving second conductor 120b form the driving line 120.

Figure 12A:
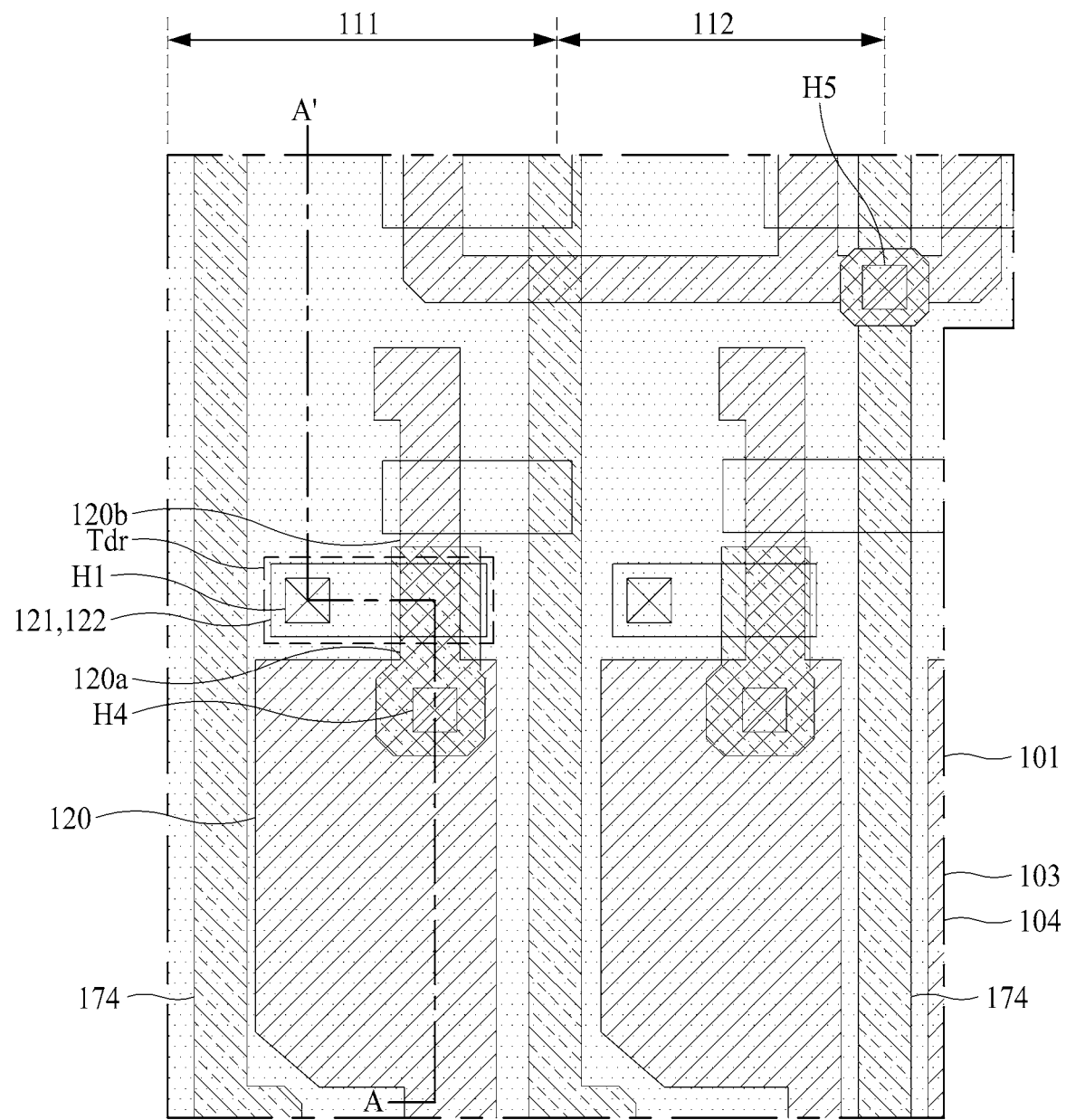
Figure 12B:
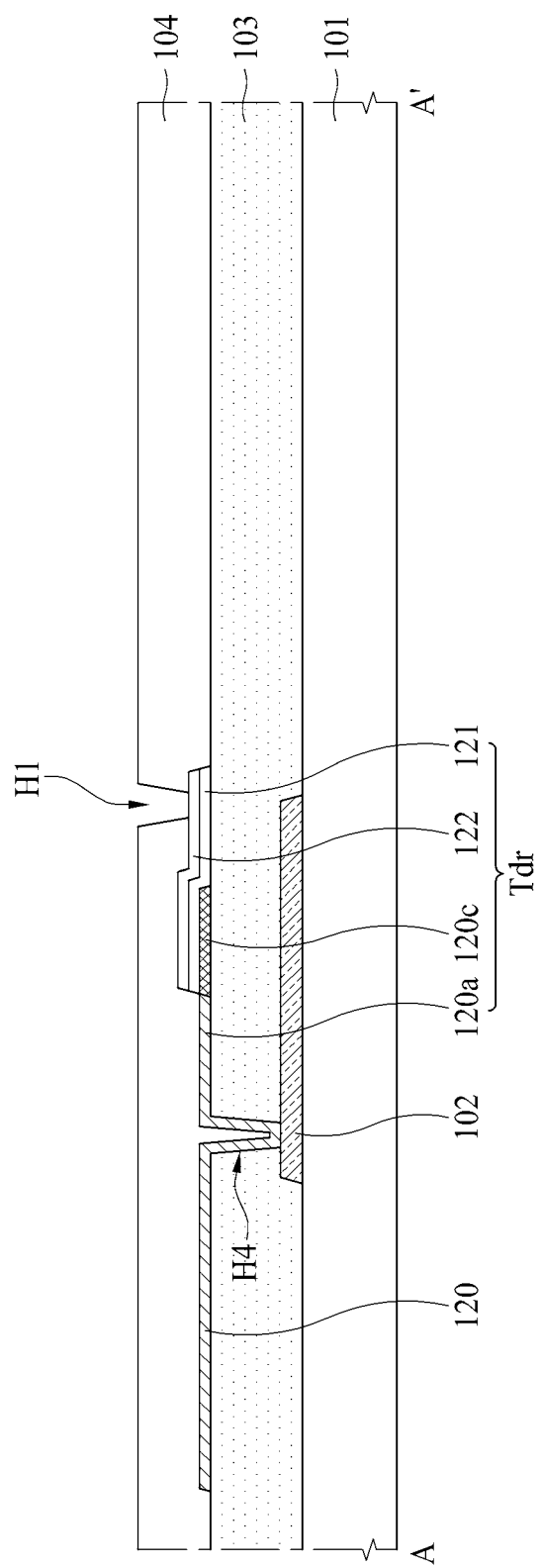

Next, as shown in FIGS. 12a and 12b, the first insulating film 104 is formed on the driving line 120, the driving transistor Tdr and the buffer 103, and a first contact hole H1 for partially exposing the driving gate electrode 122 is formed on the first insulating film 104.

In addition to the first contact hole H1, contact holes used for various purposes are formed on the first insulating film 104.

Figure 13A:
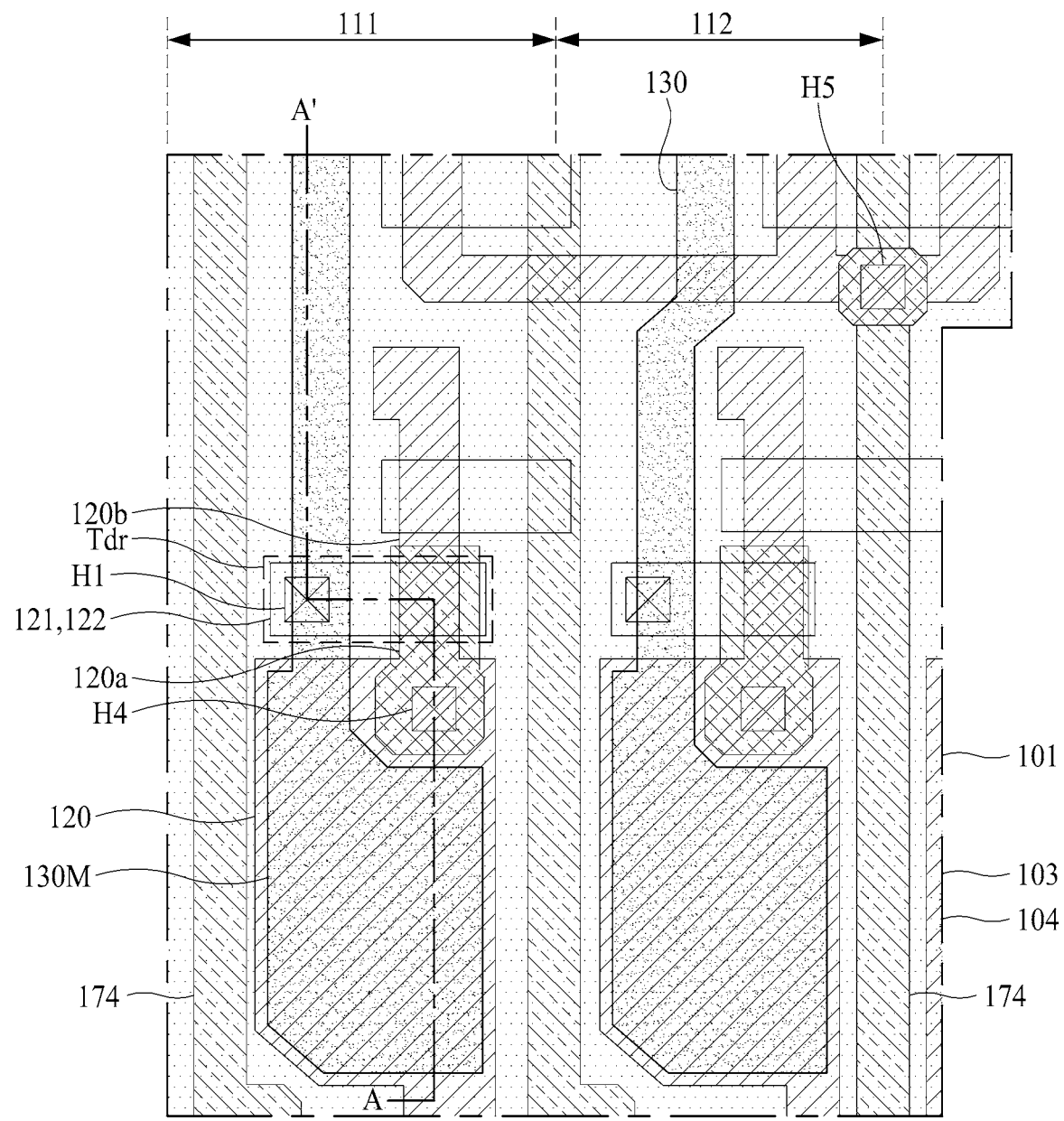
Figure 13B:
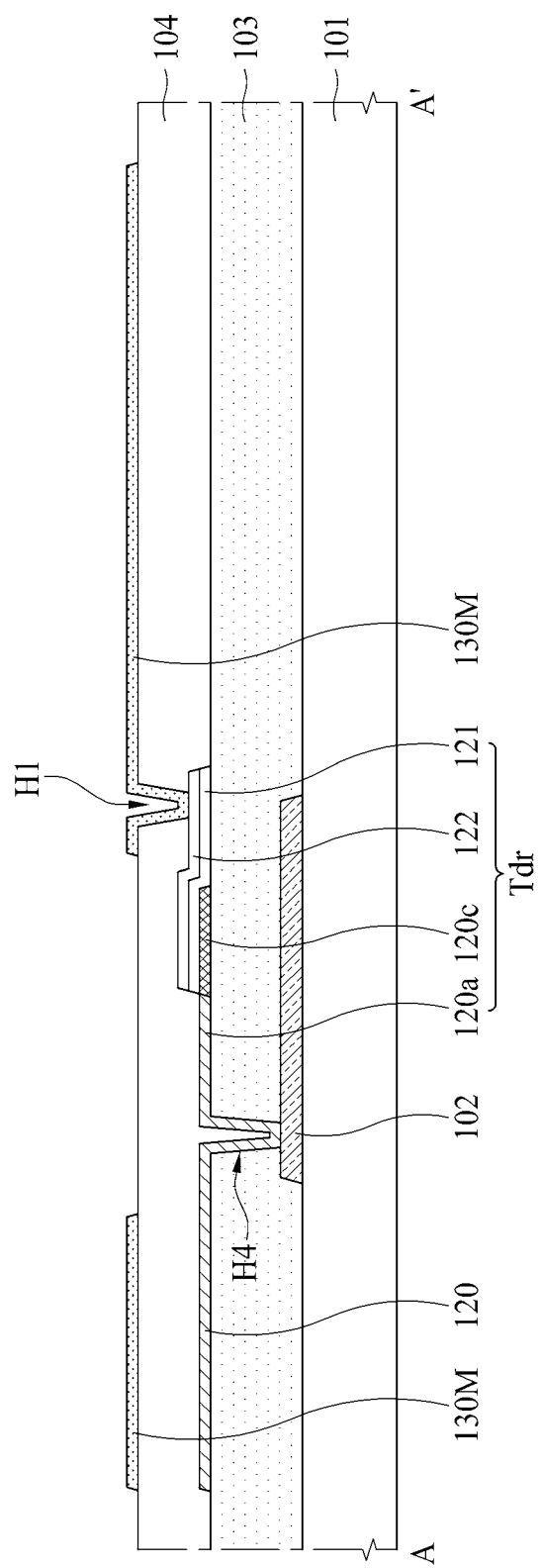

Next, as shown in FIGS. 13A and 13B, an oxide semiconductor 130M is formed on the first insulating film 104, and is connected with the driving gate electrode 122 through the first contact hole H1.

Figure 14A:
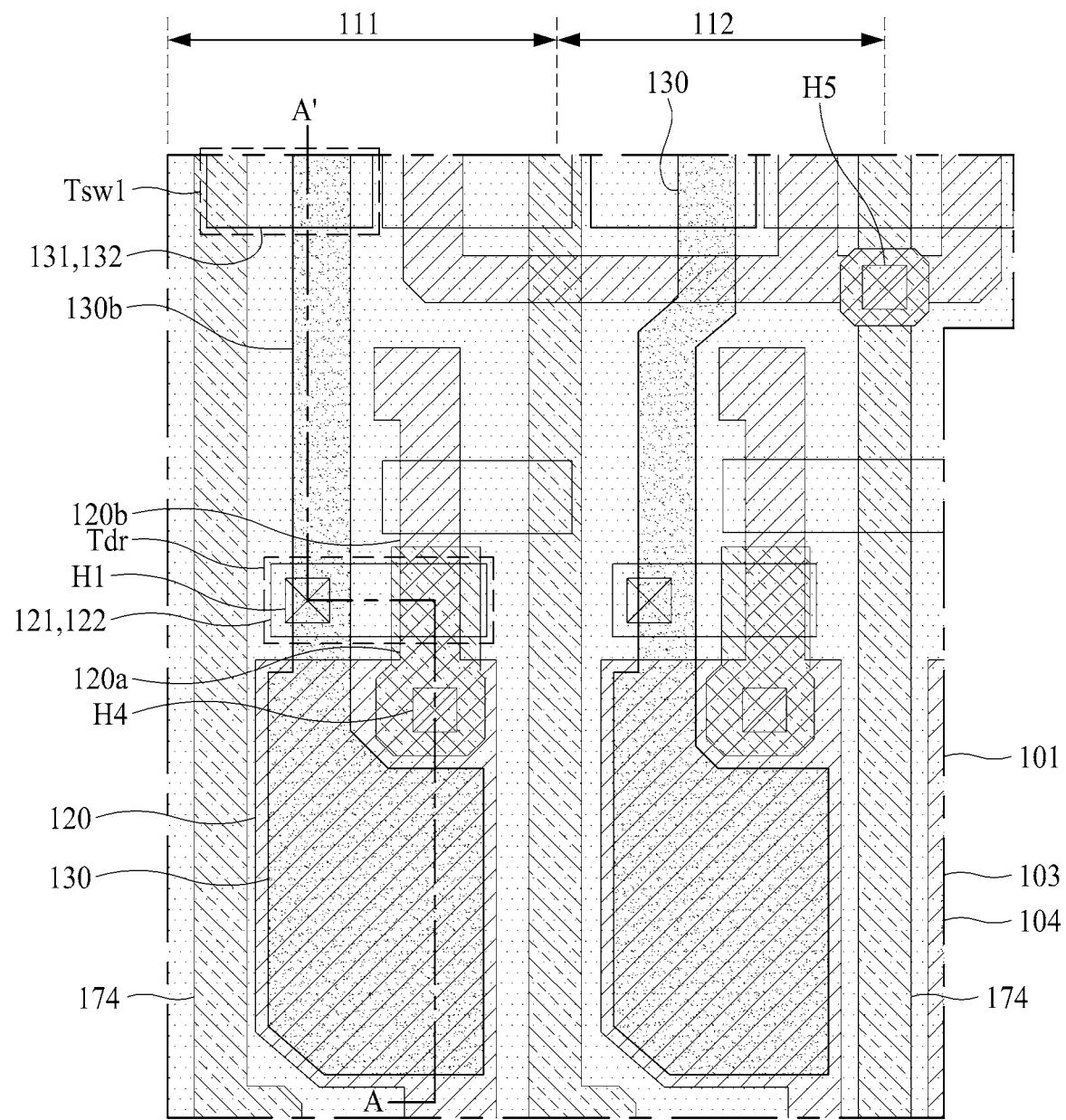
Figure 14B:
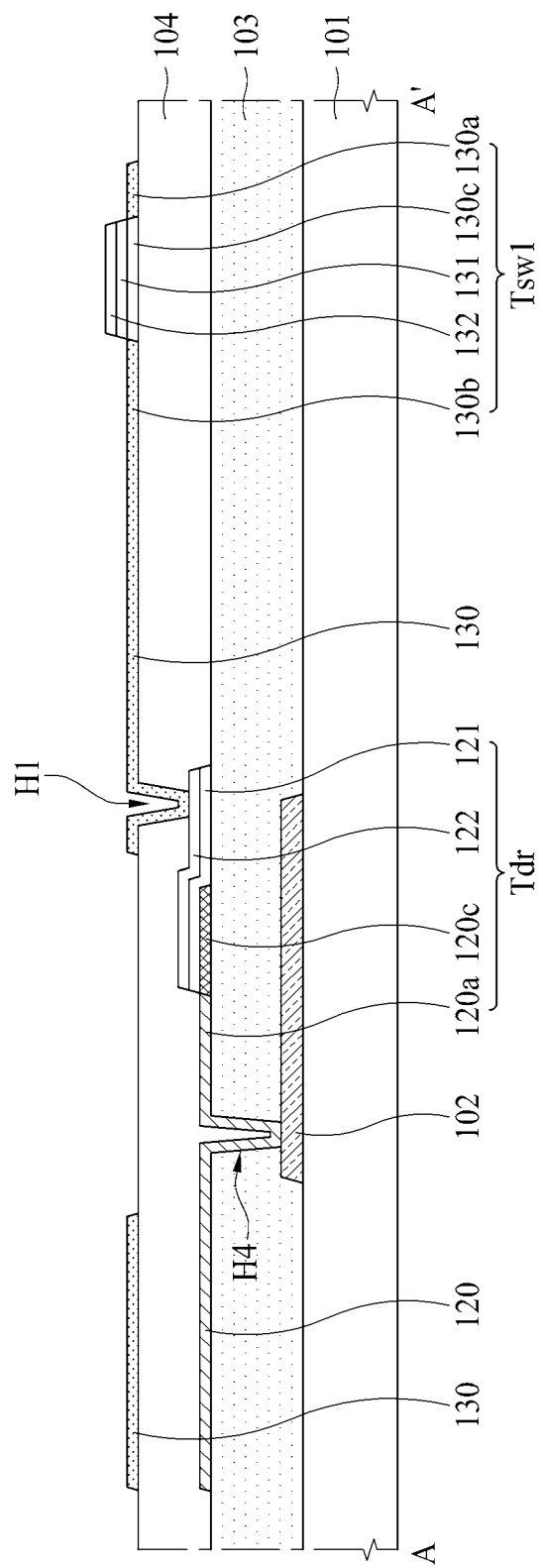

Next, as shown in FIGS. 14A and 14B, the switching gate insulating film 131 and the switching gate electrode 132 are formed on the oxide semiconductor 130M.

If plasma is irradiated into the oxide semiconductor 130M using the switching gate insulating film 131 and the switching gate electrode 132 as masks, the oxide semiconductor 130M is changed to a conductor. Since an area overlapped with the switching gate insulating film 131 and the switching gate electrode 132 of the oxide semiconductor 130M is not affected by plasma, the area is maintained as the oxide semiconductor and becomes the switching active layer 130c. The conductorized area of the oxide semiconductor 130M includes the switching first conductor 130a and the switching second conductor 130b.

The switching active layer 130c, the switching first conductor 130a, the switching second conductor 130b, the switching gate insulating film 131 and the switching gate electrode 132 form the switching transistor Tsw1.

The switching active layer 130c, the switching first conductor 130a, and the switching second conductor 130b form the switching line 130.

Figure 15A:
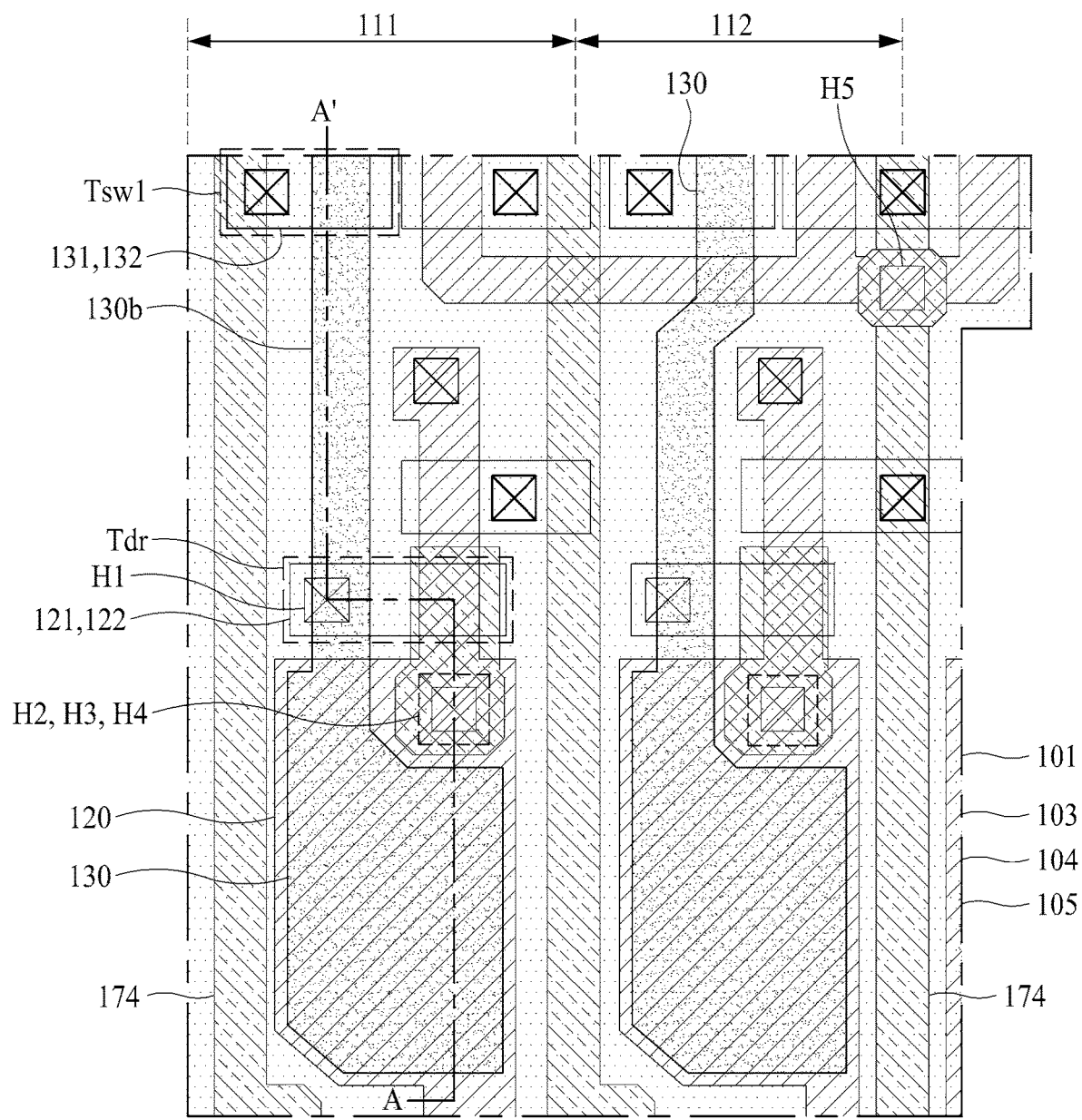
Figure 15B:
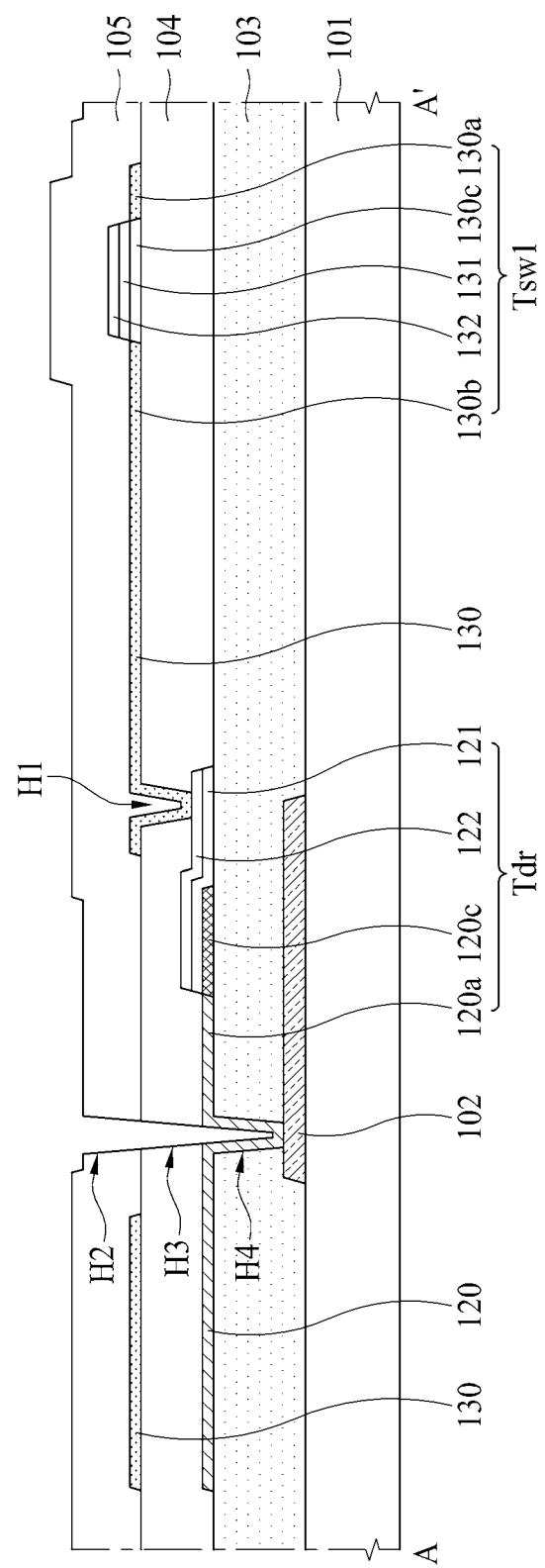

Next, as shown in FIGS. 15A and 15B, the second insulating film 105 is formed on the switching line 130, the switching transistor Tsw1 and the first insulating film 104. A second contact hole H2 for partially exposing the first insulating film 104 is formed on the second insulating film 105.

Figure 16A:
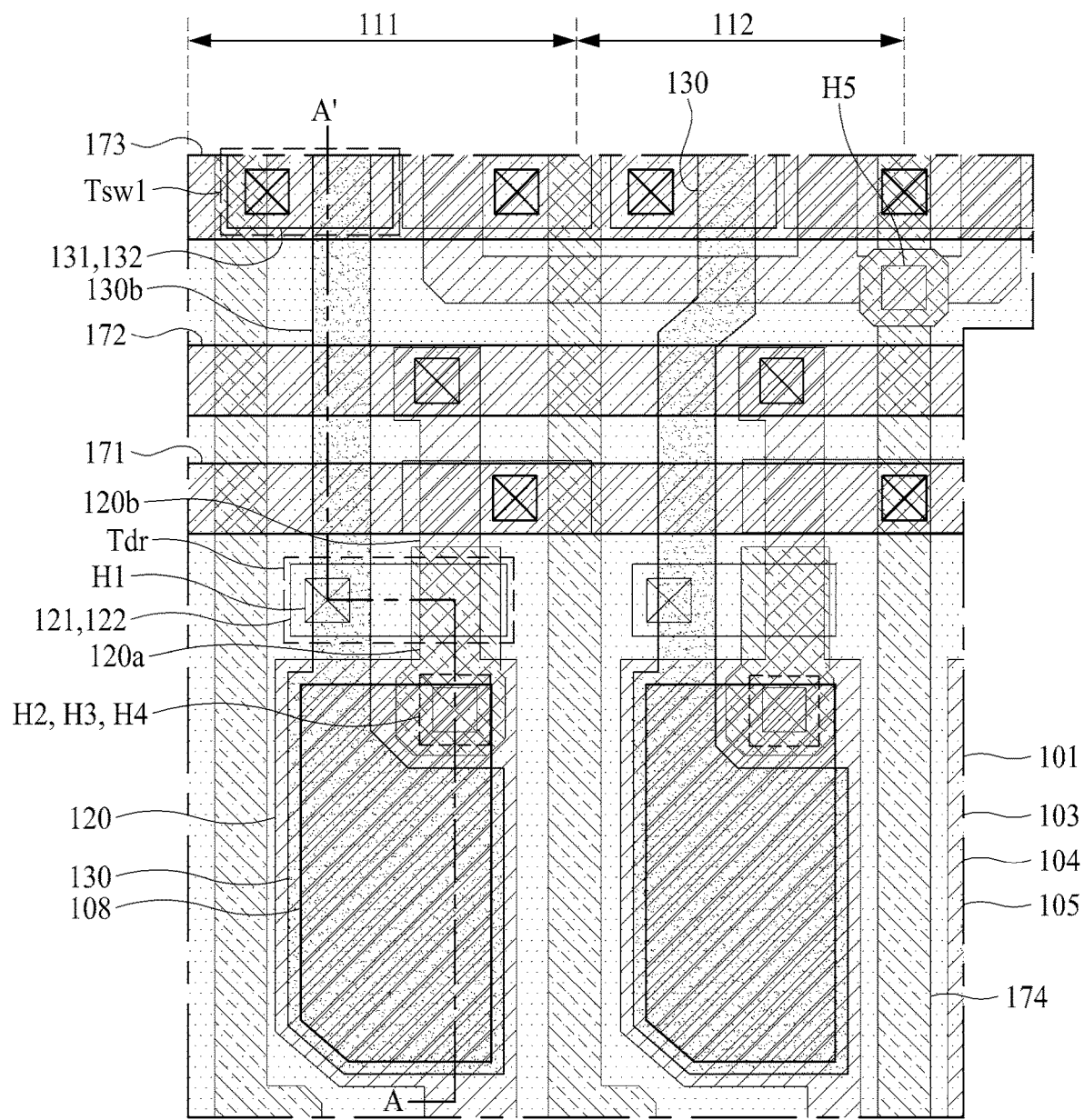
Figure 16B:
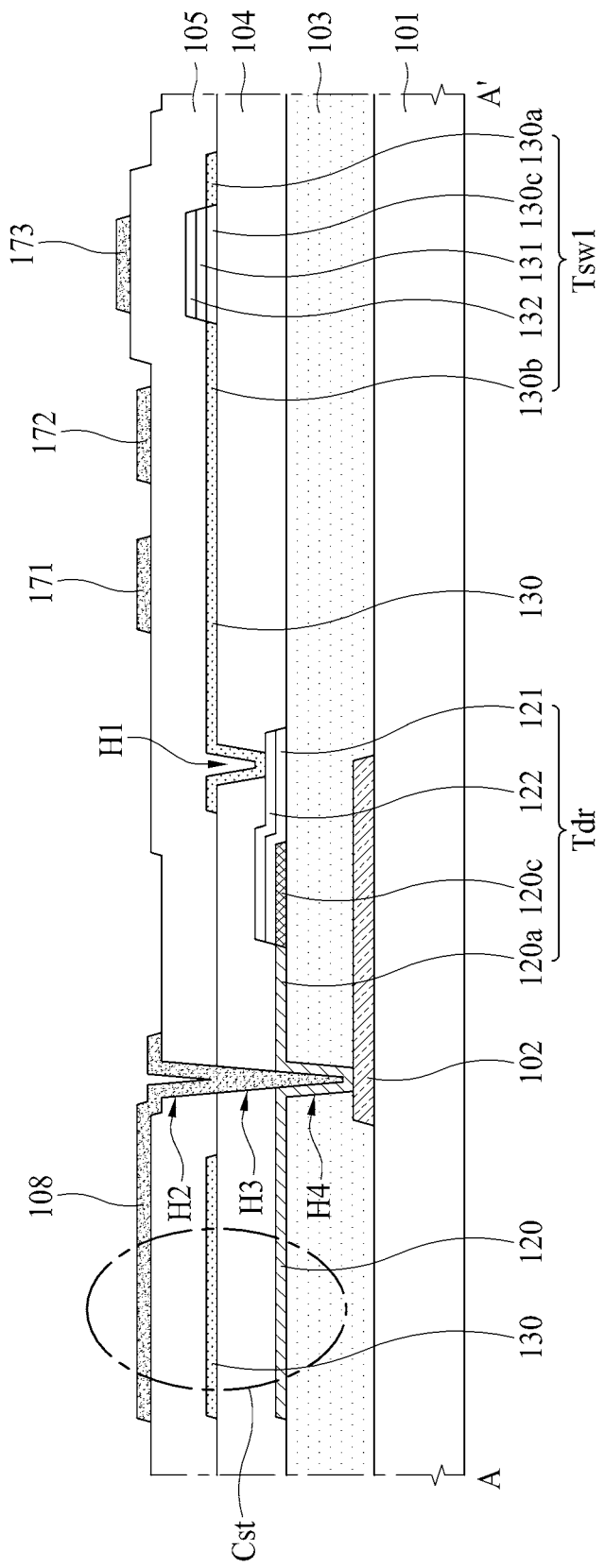

In addition to the second contact hole H2 and the third contact hole H3, contact holes used for various purposes are formed on the second insulating film 105 and the first insulating film 104. Next, as shown in FIGS. 16A and 16B, a storage capacitor electrode 108 is formed on the second insulating film 105. The storage capacitor electrode 108 is connected with the driving first conductor 120a through the second contact hole H2 and the third contact hole H3.

The emission control line 171, the first voltage supply line (PLA) 172 and the gate line (GL) 173 may be formed on the second insulating film 105. In this case, the gate line (GL) 173 is connected with the switching gate electrode 132. As described above, although the switching gate electrode 132 is connected with the gate line (GL) 173, since the gate line (GL) 173 is connected with the switching gate electrode 132 in the area other than the cross-section taken along line A-A' of FIG. 4, the switching gate electrode 132 and the gate line (GL) 173 are not connected with each other in FIG. 16B.

Finally, as shown in FIGS. 5A and 5B, the planarization film 106 is formed on the storage capacitor electrode 108 and the second insulating film 105, a sixth contact hole H6 is formed on the planarization film 106, and the organic light emitting diode OLED that includes an anode 141, a light emitting layer 142 and a cathode 143 is formed on the planarization film 106. The anode 141 is connected with the storage capacitor electrode 108 through the contact hole H6. Since the storage capacitor electrode 108 is connected with the driving first conductor 120a, the anode 141 is connected with the driving first conductor 120a.

The organic light emitting diode OLED is surrounded by a bank 107 provided on the planarization film 106, and the pixels may be partitioned by the bank 107.

In the organic light emitting display panel according to the present disclosure, which is manufactured by the above process, the switching transistor Tsw1 and the driving transistor Tdr may be provided on their respective layers, whereby an arrangement structure of the pixel driver PD of each pixel may be simplified.

Also, according to the present disclosure, since the storage capacitor Cst may additionally be formed in a space remaining due to simplification of the arrangement structure and omission of a bridge, storage capacitance may be increased, whereby performance of the driving transistor and performance of the compensation circuit may be improved.

As described above, according to the present disclosure, the following effects and advantages may be obtained.

According to the present disclosure, the switching transistor and the driving transistor may be provided on their respective layers different from each other, whereby the arrangement structure of the pixel driver of each pixel may be simplified.

Particularly, since the bridge for connecting the respective elements of the pixel driver may be omitted, the number of contact holes may be reduced as compared with the related art. Therefore, a layout of high resolution may easily be designed.

Also, according to the present disclosure, since the storage capacitor may additionally be formed in the space remaining due to simplification of the arrangement structure and omission of the bridge, storage capacitance may be increased, whereby performance of the driving transistor and performance of the compensation circuit may be improved. For example, based on high resolution of 200 ppi or more, the existing storage capacitance may be increased to three times or more in accordance with the present disclosure.

In addition to the effects of the present disclosure as mentioned above, additional advantages and features of the present disclosure will be clearly understood by those skilled in the art from the above description of the present disclosure.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting display panel, comprising:
    a substrate having thereon a plurality of pixels;
    a driving transistor provided in a first pixel of the plurality of pixels and provided on the substrate in a top gate type transistor, the driving transistor including a driving first conductor and a driving gate electrode;
    a first insulating film covering the driving transistor;
    a switching transistor provided on the first insulating film in a top gate type transistor, the switching transistor including a switching first conductor, a switching second conductor and a switching active layer;
    a second insulating film covering the first insulating film and the switching transistor;
    a planarization film provided on the second insulating film; and
    an organic light emitting diode provided on the planarization film and coupled to the driving first conductor of the driving transistor,
    wherein a switching line that includes the switching first conductor, the switching second conductor, and the switching active layer, is provided on the first insulating film,
    the switching second conductor is coupled to the driving gate electrode of the driving transistor, and
    a storage capacitor electrode for forming a storage capacitor together with the switching second conductor is provided on the second insulating film, and the storage capacitor electrode is coupled with the driving first conductor.

2. An organic light emitting display apparatus, comprising:
    the organic light emitting display panel of claim 1;
    a gate driver for supplying a gate pulse to gate lines provided in the organic light emitting display panel;

a data driver for supplying a data voltage to data lines provided in the organic light emitting display panel; and a controller for controlling the gate driver and the data driver.

3. The organic light emitting display apparatus according to claim 2, wherein the driving transistor includes a driving line having a driving active layer, a driving second conductor, and the driving first conductor, provided between the first insulating film and the substrate.

4. The organic light emitting display apparatus according to claim 3, further comprising a sensing transistor connected between the driving first conductor and a sensing line, wherein the sensing transistor includes:

a sensing first conductor extended from the driving line;

a sensing active layer provided on the same layer as the sensing first conductor and coupled to the sensing first conductor; and a sensing second conductor provided on the same layer as the sensing active layer, coupled to the sensing active layer and coupled to the sensing line.

5. The organic light emitting display apparatus according to claim 4, wherein a sensing transistor corresponding to the sensing transistor provided in the first pixel is provided in a second pixel adjacent to the first pixel, the sensing transistor provided in the second pixel includes a sensing first conductor, a sensing active layer and a sensing second conductor, which correspond to the sensing first conductor, the sensing active layer and the sensing second conductor, which are provided in the first pixel, and the sensing second conductor provided in the first pixel is coupled to the sensing second conductor provided in the second pixel on the same layer.

6. The organic light emitting display apparatus according to claim 2, wherein the storage capacitor electrode is coupled to the driving first conductor through a second contact hole provided on the second insulating film and a third contact hole provided on the first insulating film.

7. The organic light emitting display apparatus according to claim 6, wherein the storage capacitor electrode connects the driving first conductor with the organic light emitting diode.

8. The organic light emitting display apparatus according to claim 2, wherein a light shield for shielding light is provided in an area corresponding to the driving transistor of the substrate, and the first insulating film is provided on a buffer covering the light shield.

9. The organic light emitting display apparatus according to claim 8, wherein the driving first conductor is coupled to the light shield through a fourth contact hole provided on the buffer.

10. The organic light emitting display apparatus according to claim 2, wherein the switching second conductor is coupled to the driving gate electrode through a first contact hole provided on the first insulating film.

11. The organic light emitting display panel according to claim 1, wherein the driving transistor further includes a driving line having a driving active layer and a driving second conductor, wherein the driving first conductor is provided between the first insulating film and the substrate.

12. The organic light emitting display panel according to claim 11, further comprising a sensing transistor connected between the driving first conductor and a sensing line, wherein the sensing transistor includes:

a sensing first conductor extended from the driving line;

a sensing active layer provided on the same layer as the sensing first conductor and coupled to the sensing first conductor; and a sensing second conductor provided on the same layer as the sensing active layer, coupled to the sensing active layer and coupled to the sensing line.

13. The organic light emitting display panel according to claim 12, wherein a sensing transistor corresponding to the sensing transistor provided in the first pixel is provided in a second pixel adjacent to the first pixel, the sensing transistor provided in the second pixel includes a sensing first conductor, a sensing active layer and a sensing second conductor, which correspond to the sensing first conductor, the sensing active layer and the sensing second conductor, which are provided in the first pixel, and the sensing second conductor provided in the first pixel is coupled to the sensing second conductor provided in the second pixel on the same layer.

14. The organic light emitting display panel according to claim 13, wherein a buffer is provided between the first insulating film and the substrate, the sensing line is provided between the buffer and the substrate, and the sensing second conductor provided in the first pixel and sensing second conductor provided in the second pixel are coupled to the sensing line through a fifth contact hole provided on the buffer.

15. The organic light emitting display panel according to claim 11, wherein the switching second conductor and the driving first conductor are overlapped with each other by interposing the first insulating film therebetween.

16. The organic light emitting display panel according to claim 1, wherein the storage capacitor electrode is coupled with the driving first conductor through a second contact hole provided on the second insulating film and a third contact hole provided on the first insulating film.

17. The organic light emitting display panel according to claim 16, wherein the storage capacitor electrode connects the driving first conductor with the organic light emitting diode.

18. The organic light emitting display panel according to claim 1, wherein a light shield for shielding light is provided in an area corresponding to the driving transistor of the substrate, and the first insulating film is provided on a buffer covering the light shield.

19. The organic light emitting display panel according to claim 18, wherein the driving first conductor is coupled to with the light shield through a fourth contact hole provided on the buffer.

20. The organic light emitting display panel according to claim 1, wherein the switching second conductor is connected with the driving gate electrode through a first contact hole provided on the first insulating film.

* * * * *